(12) United States Patent
Chun

(10) Patent No.: US 11,568,905 B2
(45) Date of Patent: Jan. 31, 2023

(54) PAGE BUFFER AND MEMORY DEVICE INCLUDING THE SAME

(71) Applicant: SAMSUNG ELECTRONICS CO., LTD., Suwon-si (KR)

(72) Inventor: Jinyoung Chun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 17/200,246

(22) Filed: Mar. 12, 2021

(65) Prior Publication Data
US 2021/0201963 A1     Jul. 1, 2021

Related U.S. Application Data

(62) Division of application No. 16/738,598, filed on Jan. 9, 2020, now Pat. No. 10,978,113.

(30) Foreign Application Priority Data

May 28, 2019   (KR) ........................ 10-2019-0062740

(51) Int. Cl.
    *G11C 7/10*          (2006.01)
    *G11C 7/12*          (2006.01)
    (Continued)

(52) U.S. Cl.
    CPC .......... *G11C 7/1021* (2013.01); *G11C 7/1039* (2013.01); *G11C 7/1057* (2013.01);
    (Continued)

(58) Field of Classification Search
    CPC ....... G11C 7/1021; G11C 7/12; G11C 7/1057; G11C 11/4074; G11C 7/1039; G11C 7/222; G11C 7/1084
    See application file for complete search history.

(56) References Cited

U.S. PATENT DOCUMENTS 6,822,904 B2    11/2004   Gallo et al.
7,379,337 B2    5/2008     Park
                      (Continued)

FOREIGN PATENT DOCUMENTS

KR        10-1014968 A     2/2011

OTHER PUBLICATIONS

Notice of Allowance dated Dec. 30, 2020 in parent U.S. Appl. No. 16/738,598.

*Primary Examiner* — Tri M Hoang
(74) *Attorney, Agent, or Firm* — Sughrue Mion, PLLC

(57) ABSTRACT

A page buffer includes a charging circuit, first and second storage circuits, and a selection circuit. The charging circuit charges a bit line during a precharging period. The first storage circuit determines and stores data corresponding to a state of a selected memory cell among memory cells connected to the bit line while the charging circuit charges the bit line. The second storage circuit, which is a circuit separate from the first storage circuit, determines and stores data corresponding to a state of the selected memory cell after the precharging period. The selection circuit outputs a control voltage controlling a switch element connected between the bit line and the charging circuit, and determines a magnitude of the control voltage during the precharging period, based on the data stored in the first storage circuit.

8 Claims, 18 Drawing Sheets

(51) Int. Cl.
*G11C 7/22* (2006.01)
*G11C 11/4074* (2006.01)

(52) U.S. Cl.
CPC ............. *G11C 7/1084* (2013.01); *G11C 7/12* (2013.01); *G11C 7/222* (2013.01); *G11C 11/4074* (2013.01)

(56) References Cited

U.S. PATENT DOCUMENTS

| | | |
|---|---|---|
| 7,920,435 B2 | 4/2011 | Ogawa |
| 9,721,671 B2 | 8/2017 | Chu et al. |
| 10,079,060 B2 * | 9/2018 | Jo ........................ G11C 29/028 |
| 10,204,686 B2 | 2/2019 | Lee et al. |
| 10,332,593 B2 * | 6/2019 | Sasaki ................. G11C 11/5642 |
| 10,418,080 B2 * | 9/2019 | Shin ........................ G11C 7/12 |
| 10,453,505 B2 * | 10/2019 | Hess ..................... G11C 11/419 |
| 10,586,587 B2 * | 3/2020 | Dozaka .............. G11C 11/4096 |
| 10,818,360 B2 * | 10/2020 | Lee ...................... G06F 3/0679 |
| 10,872,661 B2 * | 12/2020 | Xue ................... G11C 13/0061 |
| 10,957,403 B2 * | 3/2021 | Deguchi ................ G11C 16/30 |
| 11,004,501 B2 * | 5/2021 | Chen ................... G11C 11/5642 |
| 2017/0047125 A1 | 2/2017 | Iwai et al. |

\* cited by examiner

PAGE BUFFER AND MEMORY DEVICE INCLUDING THE SAME

CROSS-REFERENCE TO RELATED APPLICATION(S)

This application is a divisional of U.S. application Ser. No. 16/738,598 filed on Jan. 9, 2020, now U.S. Pat. No. 10,978,113, which claims priority from Korean Patent Application No. 10-2019-0062740 filed on May 28, 2019 in the Korean Intellectual Property office, the disclosures of which are incorporated by reference herein in their entirety.

BACKGROUND

1. Field

The present disclosure relates to a page buffer and a memory device including the same.

2. Description of Related Art

Memory devices may include a plurality of memory cells that store data, and the plurality of memory cells may be connected to page buffers by bit lines. Page buffers may read data stored in respective memory cells with bit lines. To read data stored in a memory cell, a page buffer may adjust a voltage of a bit line connected to a memory cell. Recently, various methods have been proposed in which the page buffer may effectively adjust the voltage of a bit line.

SUMMARY

It is an aspect to provide a page buffer in which performance may be improved by reducing the time required for a precharging operation of charging a bit line in a reading operation of reading data from a memory cell, and a memory device including the same.

According to an aspect of an embodiment, there is provided a page buffer includes a charging circuit configured to charge a bit line during a precharging period, a first storage circuit configured to determine and store data corresponding to a state of a selected memory cell among a plurality of memory cells connected to the bit line while the charging circuit charges the bit line, a second storage circuit, which is a circuit separate from the first storage circuit, configured to determine and store data corresponding to a state of the selected memory cell after the precharging period, and a selection circuit configured to output a control voltage controlling a switch element connected between the bit line and the charging circuit, and determine a magnitude of the control voltage during the precharging period, based on the data stored in the first storage circuit.

According to another aspect of the present inventive concept, a memory device includes a memory cell array including a plurality of memory cells, and a plurality of bit lines connected to the plurality of memory cells, and a memory controller configured to read data corresponding to a threshold voltage of a selected memory cell connected to a selected bit line among the plurality of bit lines, input a first charging current to the selected bit line during a first period of time, and input a second charging current lower than the first charging current to the selected bit line during a second period of time, after the first period of time when a threshold voltage of the selected memory cell is higher than a reference voltage.

According to another aspect of the present inventive concept, a memory device includes a memory cell array including a plurality of memory cells connected to a plurality of bit lines, each of the plurality of memory cells having one of a first threshold voltage and a second threshold voltage lower than the first threshold voltage, and a memory controller configured to simultaneously charge a first bit line connected to a first memory cell having the first threshold voltage and a second bit line connected to a second memory cell having the second threshold voltage, and configured to simultaneously charge the first bit line and the second bit line by inputting a first charging current to the first bit line and inputting a second charging current different from the first charging current to the second bit line.

According to another aspect of the present inventive concept, a method of operating a memory device includes determining a selected bit line connected to a selected memory cell from which data is to be read, from among a plurality of bit lines, precharging the selected bit line by inputting a charging current to the selected bit line, reading a threshold voltage of the selected memory cell while the selected bit line is precharged, and maintaining or decreasing the charging current, based on the threshold voltage of the selected memory cell, while the selected bit line is precharged.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, example embodiments will be described with reference to the accompanying drawings.

Figure 1:
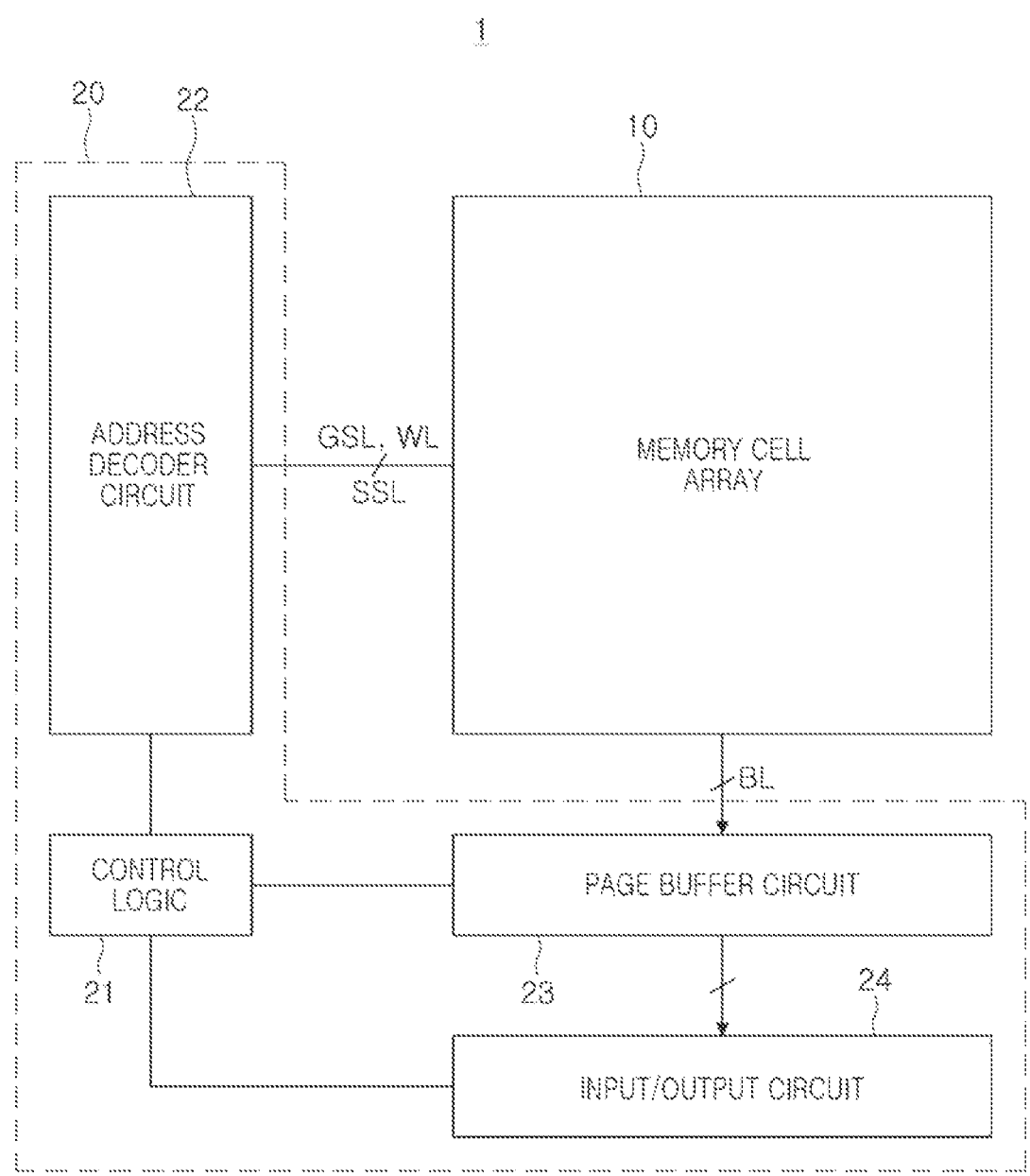
FIG. 1 is a block diagram schematically illustrating a memory device according to an example embodiment.

FIG. 1 is a block diagram schematically illustrating a memory device according to an example embodiment.

Referring first to FIG. 1, a memory device 1 may include a memory cell array 10 and a memory controller 20. The memory cell array 10 may include a plurality of memory cells, and at least portions of the plurality of memory cells may be connected to each other to provide a memory cell string. The memory cell array 10 may include a plurality of memory cell strings, and the plurality of memory cell strings may be divided into a plurality of blocks. The memory controller 20 may include a control logic 21, an address decoder circuit 22, a page buffer circuit 23, an input/output circuit 24, and the like.

In an example embodiment, the address decoder circuit 22 may be connected to memory cells via a word line WL, a string select line SSL, and a ground select line GSL or the like, and the page buffer circuit 23 may be connected to memory cells via a bit line BL. In an example embodiment, the address decoder circuit 22 may select a memory cell to which data is written or from which data is read, and may receive address information to select a memory cell.

The page buffer circuit 23 may write data to the selected memory cell selected by the address decoder circuit 22 or read data from the selected memory cell. In an example embodiment, the page buffer circuit 23 may write or read data on a page basis. The page buffer circuit 23 may include a plurality of page buffers, and each of the plurality of page buffers may be connected to at least one bit line BL. Data to be written to the memory cell array 10 by the page buffer circuit 23 or data read from the memory cell array 10 by the page buffer circuit 23 may be input and output through the input/output circuit 24. Operations of the address decoder circuit 22, the page buffer circuit 23, and the input/output circuit 24 may be controlled by the control logic 21.

Figure 2:
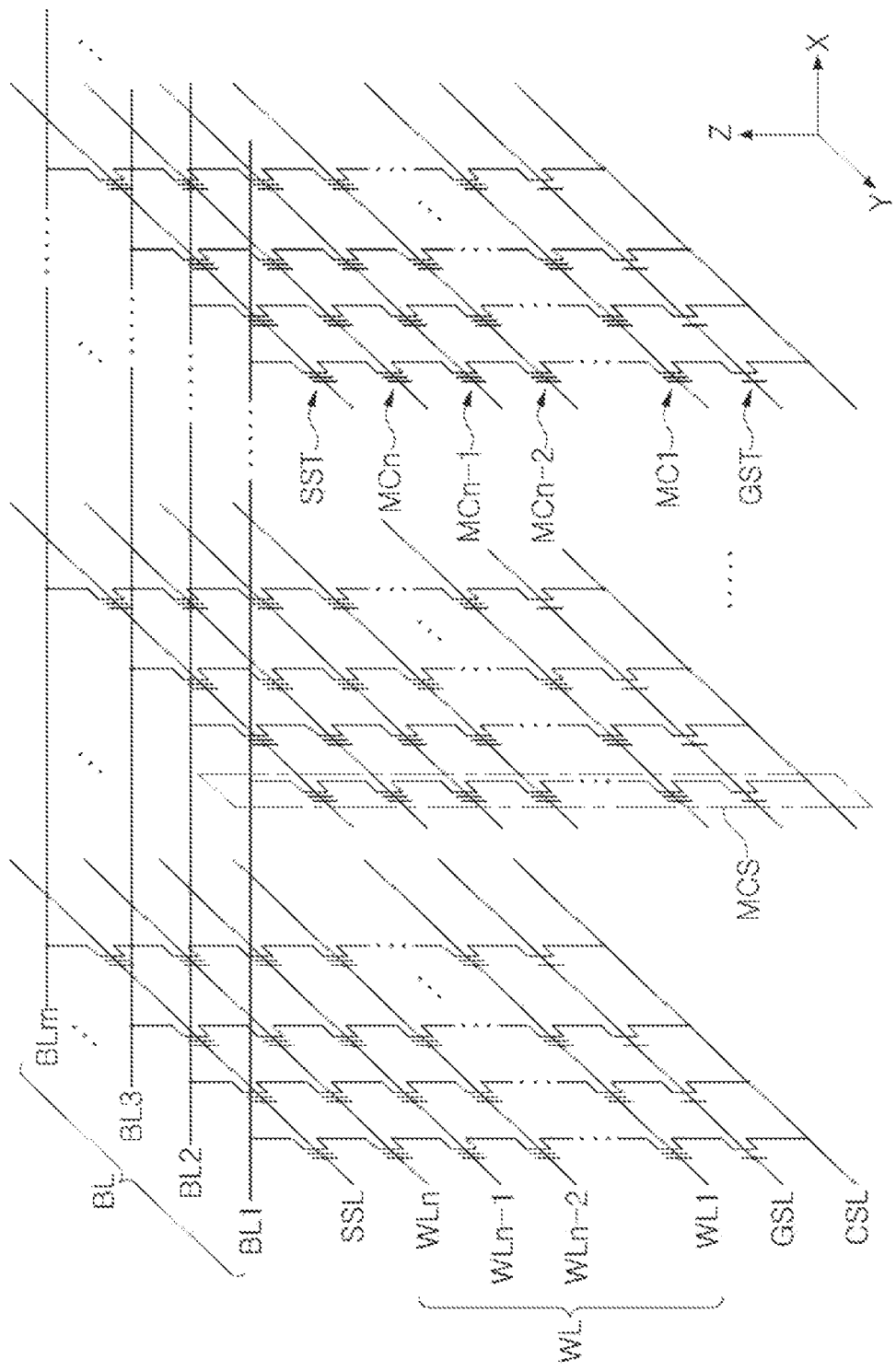
FIG. 2 is a circuit diagram schematically illustrating a memory cell array of a memory device according to an example embodiment.

FIG. 2 is a schematic circuit diagram of a memory cell array of a memory device according to an example embodiment.

Referring to FIG. 2, a memory cell array of a memory device may include a plurality of memory cell strings MCS. Each of the plurality of memory cell strings MCS may include a plurality of memory cells MC1 to MCn, a ground selection transistor GST, a string selection transistor SST and the like. The number of the ground selection transistors GST and the string selection transistors SST included in the memory cell string MCS may be changed, and the memory cell string MCS may further include a dummy memory cell.

The plurality of memory cells MC1 to MCn may be connected to a plurality of word lines WL1 to WLn (word lines WL). The ground selection transistor GST may be connected to a common source line CSL and a ground select line GSL. The string selection transistor SST is connected to at least one of bit lines BL1 to BLm (bit lines BL), and may be controlled by a voltage input to the string select line SSL.

Each of the word lines WL may be shared by two or more memory cell strings MCS. Each of the bit lines BL may also be shared by two or more memory cell strings MCS. Channel regions of the memory cells MC1 to MCn in each of the memory cell strings MCS may be connected to each other, and the bit lines BL may be electrically connected to the channel regions of the memory cell strings MCS.

The bit lines BL may be connected to the page buffer. The page buffer may perform operations such as reading data from a selected memory cell among the memory cells MC1 to MCn through the bit lines BL, or writing data to the selected memory cell. Hereinafter, the connection relationship between the memory cell array and the page buffer will be described with reference to FIG. 3.

Figure 3:
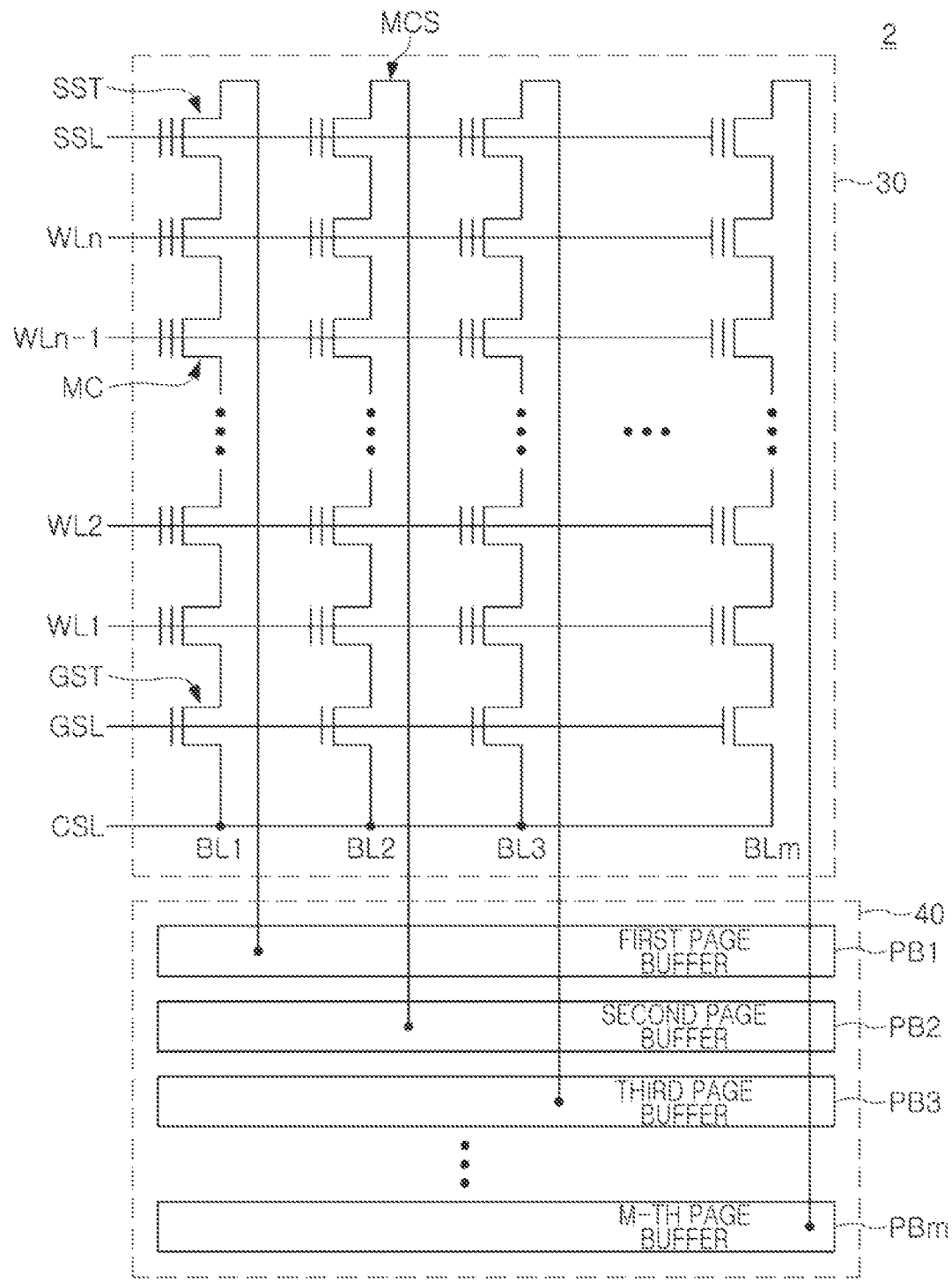
FIG. 3 is a drawing illustrating a connection relationship between a memory cell array and a page buffer in a memory device according to an example embodiment.

FIG. 3 is a diagram illustrating a connection relationship between a memory cell array and a page buffer in a memory device according to an example embodiment.

Referring to FIG. 3, a memory device 2 may include a plurality of memory cells MC, and a plurality of page buffers PB1 to PBm. Portions of the plurality of memory cells MC are connected to each other and may provide a memory cell string MCS. The memory cell string MCS may be provided at the intersection of the plurality of word lines WL1 to WLn and the plurality of bit lines BL1 to BLm.

In the example embodiment illustrated in FIG. 3, the ground selection transistor GST has a structure different from that of the memory cells MC, and the string selection transistor SST has the same structure as that of the memory cells MC, but example embodiments thereof are not limited thereto. For example, when the memory cell string MCS is formed to have a three-dimensional structure, each of the plurality of bit lines BL1 to BLn includes a plurality of memory cell strings MCS connected to different string select lines SSL.

The plurality of memory cell strings MCS may be included in one memory block 30, and the memory cell array may include a plurality of memory blocks 30. When the memory cell strings MCS included in the memory block 30 are connected to m bit lines BL1 to BLm, the page buffer circuit 40 may include m page buffers PB1 to PBm corresponding to the bit lines BL1 to BLm. As in the example embodiment of FIG. 3, the page buffers PB1 to PBm may be connected to the bit lines BL1 to BLm, respectively, and may store or read data to be stored or read through the bit lines BL1 to BLm. The page buffers PB1 to PBm may include at least one storage circuit storing data. The storage circuit may be implemented as a latch circuit, a buffer circuit or the like.

As an example, in the architecture of the memory device 2, the page buffers PB1 to PBm connected to one memory block 30 may be arranged in a predetermined direction (e.g., a vertical direction in FIG. 3). Each of the page buffers PB1 to PBm includes a charging circuit inputting a voltage to one of the bit lines BL1 to BLm in addition to the storage circuit to precharge a sensing node, a selection circuit controlling the operation of the charging circuit, and the like. Each of the page buffers PB1 to PBm may include a plurality of semiconductor devices to implement the circuits.

Figure 4:
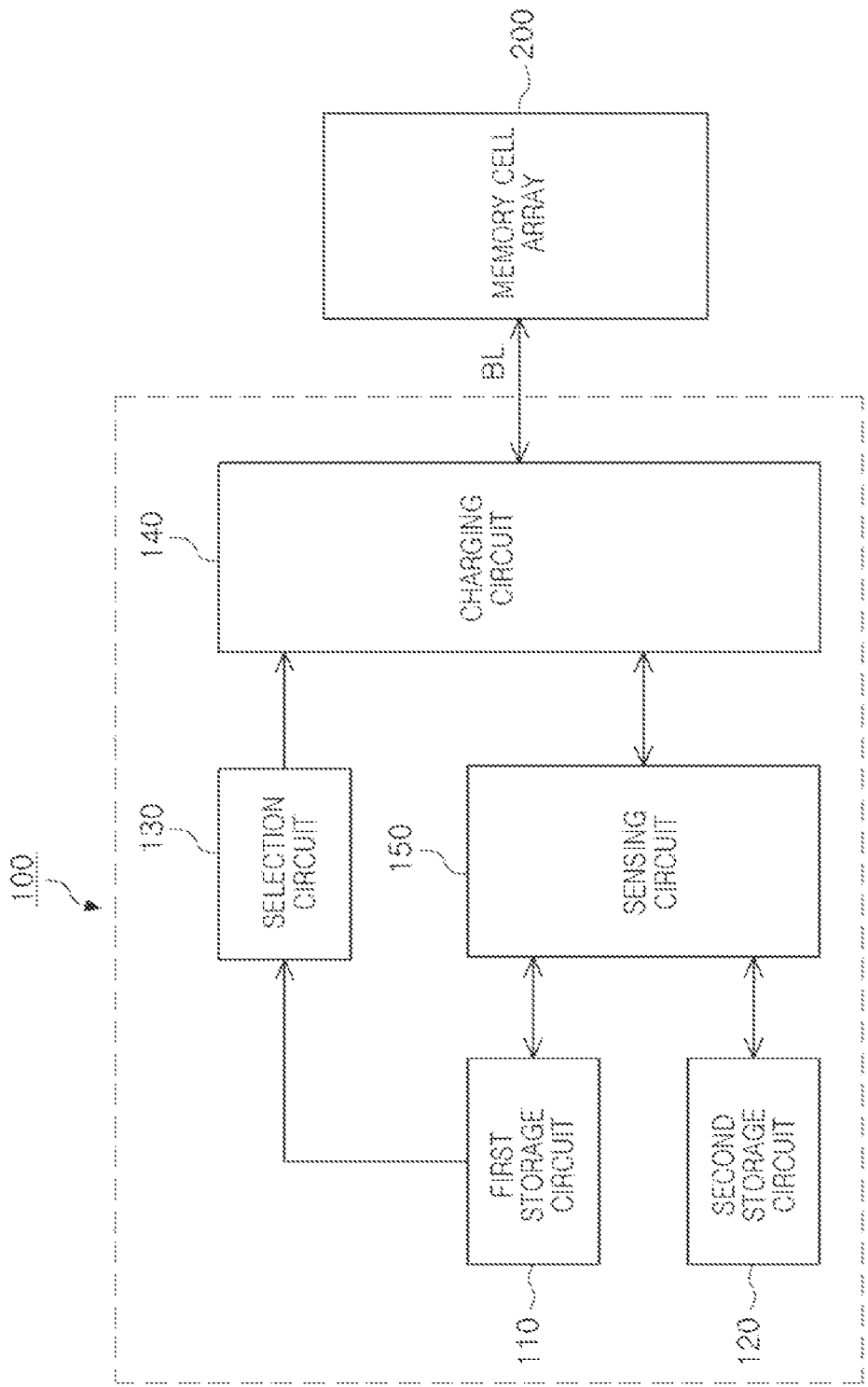
FIG. 4 is a block diagram schematically illustrating a page buffer according to an example embodiment.

FIG. 4 is a schematic block diagram of a page buffer according to an example embodiment.

Referring to FIG. 4, a page buffer 100 may include a plurality of storage circuits 110 and 120, a selection circuit 130, a charging circuit 140, a sensing circuit 150, and the like. The plurality of storage circuits may include a first storage circuit 110 and a second storage circuit 120. As an example, the first storage circuit 110 and the second storage circuit 120 may operate at different times.

The sensing circuit 150 may include a sensing node connected to the first storage circuit 110 and the second storage circuit 120. In an example embodiment, data of a selected memory cell may correspond to a voltage of the sensing node in a reading operation, and the first storage circuit 110 and the second storage circuit 120 may detect the voltage of the sensing node to store the data of the selected memory cell.

The page buffer 100 may be connected to at least a portion of the plurality of memory cells included in a memory cell array 200 through the bit line BL. As an example, the charging circuit 140 of the page buffer 100 may be connected to the bit line BL, and the page buffer 100 may control the voltage of the bit line BL, using the charging circuit 140, to read the data of the selected memory cell from among the plurality of memory cells or to write the data to the selected memory cell. The page buffer 100 may perform a precharging operation of charging the bit line BL using the charging circuit 140.

The charging circuit 140 may perform the precharging operation of supplying an electric charge to the bit line BL to increase the voltage of the bit line BL to a target voltage. For example, the charging circuit 140 may supply the electric charge by inputting a charging current to the bit line BL, and the target voltage may be changed depending on the operation performed by the page buffer 100. As an example, the target voltage in a programming operation in which the page buffer 100 writes data to the selected memory cell may be different from a target voltage in a reading operation in which data is read from the selected memory cell.

In an example embodiment, the charging current input to the bit line BL by the charging circuit 140 may be changed by the selection circuit 130. While the precharging operation in which the charging circuit 140 inputs the charging current to the bit line BL is performed, the page buffer 100 firstly reads the data of the selected memory cell through the sensing circuit 150 to store the data in the storage circuit 110. The selection circuit 130 may adjust the amount of charge supplied to the bit line BL by the charging circuit 140, depending on the data stored in the first storage circuit 110. For example, the selection circuit 130 may adjust a magnitude of the charging current input to the bit line BL by the charging circuit 140.

For example, the time required for precharging and/or the voltage magnitude of the bit line BL after completion of the precharging operation may be changed depending on the data stored in the selected memory cell and/or influences of other bit lines adjacent to the bit line BL. The data stored in the selected memory cell may be determined depending on the magnitude of a threshold voltage of the selected memory cell. The time required for precharging the bit line BL may be increased as the threshold voltage of the selected memory cell increases.

In an example embodiment, the data of the selected memory cell may be roughly detected while the precharging operation is performed, and the magnitude of the charging current input to the bit line BL may be maintained or changed accordingly. The page buffer 100 may roughly detect the data of the selected memory cell to store the data in the first storage circuit 110. The selection circuit 130 refers to the data stored in the first storage circuit 110 to maintain or reduce the magnitude of the charging current input to the bit line BL by the charging circuit 140.

In an example embodiment, by using a method in which the magnitude of the charging current output by the charging circuit 140 is maintained or reduced or a method in which a switch element between the charging circuit 140 and the bit line BL is controlled while maintaining the magnitude of the charging current output by the charging circuit 140; the magnitude of charging current input to the bit line BL may be adjusted. The charging circuit 140 may include a circuit capable of outputting different charging currents in response to a signal from the selection circuit 150.

Figure 5:
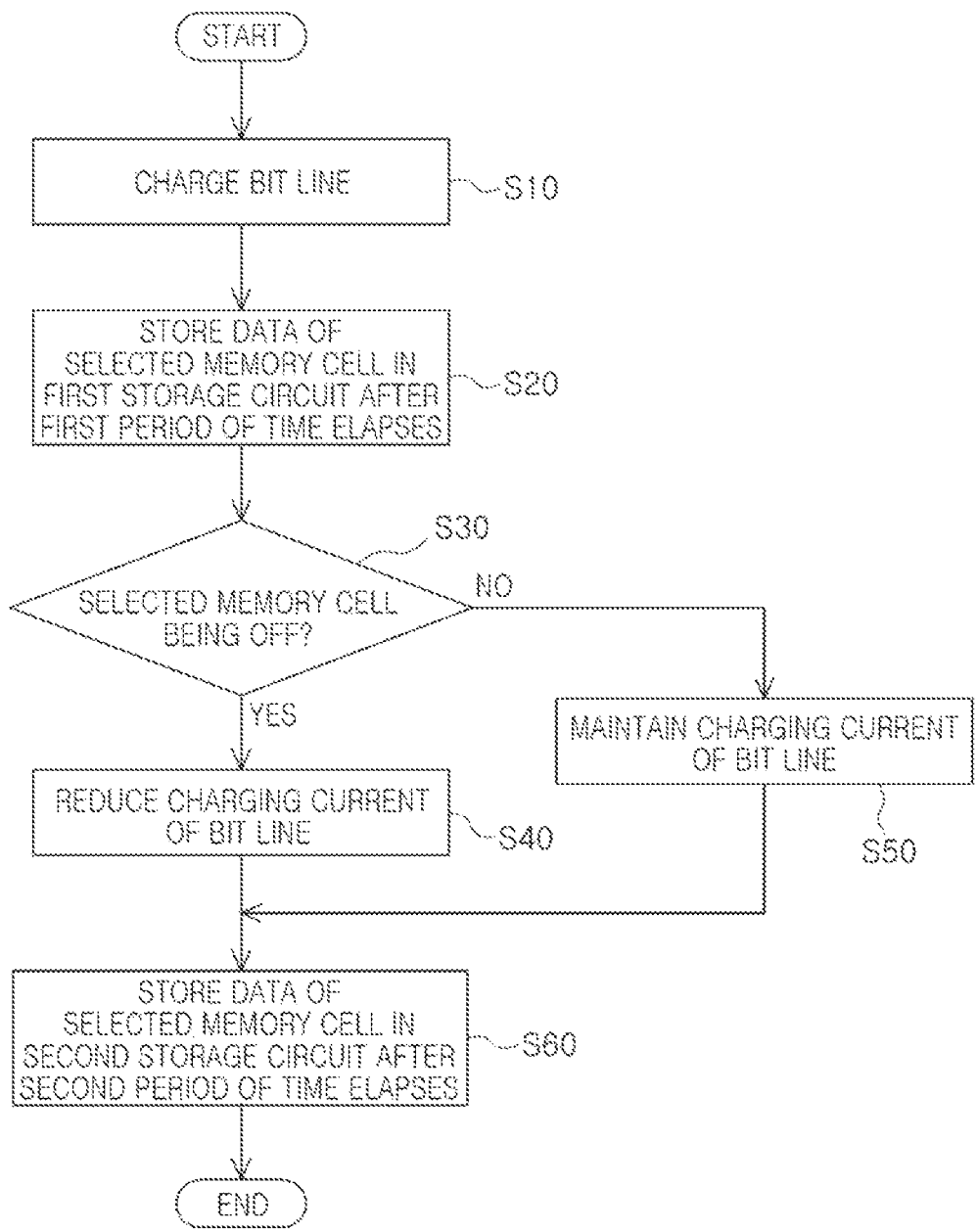
FIG. 5 is a flowchart illustrating an operation of a page buffer according to an example embodiment.

FIG. 5 is a flowchart illustrating an operation of a page buffer according to an example embodiment.

Referring to FIG. 5, the operation of the page buffer according to an example embodiment may be started by charging a bit line by a page buffer (S10). The page buffer may include a charging circuit connected to the bit line, and may charge the bit line by applying a voltage to the bit line using the charging circuit. The operation of charging the bit line may be defined as a precharging operation.

After the precharging operation has started and a first period of time has elapsed from the start of the precharging operation, the page buffer may store data of a selected memory cell connected to the bit line in a first storage circuit (S20). The first storage circuit may be a latch circuit or a buffer circuit included in the page buffer. The first period of time may be a time that is insufficient to complete the precharging operation. For example, the page buffer may approximately sense the data of the selected memory cell and store the data in the first storage circuit before the precharging operation is completed so that the bit line reaches a target voltage. In an example, the data of the selected memory cell stored in the first storage circuit may correspond to a threshold voltage of the selected memory cell.

The page buffer may use the data stored in the first storage circuit to determine whether the state of the selected memory cell is OFF (S30). In an example embodiment, the selected memory cell may be in an OFF state or an ON state depending on the threshold voltage, and the selected memory cell may have a relatively great threshold voltage in the OFF state.

When it is determined in operation S30 that the state of the selected memory cell is OFF (S30, YES), the page buffer may reduce the magnitude of the charging current input to the bit line (S40). When it is determined in operation S30 that the state of the selected memory cell is ON (S30, NO), the page buffer may maintain the charging current input to the bit line as is (S50). In an example embodiment, the page buffer may control the magnitude of the current flowing in a switch element by controlling the control voltage input to the switch element connected between the charging circuit and the bit line. The magnitude of the charging current may be changed by adjusting the magnitude of the current flowing in the switch element. The magnitude of the charging current input to the bit line may be reduced or maintained after the charging of the bit line begins and the first period of time elapsed.

When a second period of time elapses after the first period of time (i.e., after the data is stored in the first storage circuit), the page buffer may read the data of the selected memory cell and store the data in a second storage circuit (S60). The sum of the first period of time and the second period of time may be a time period sufficient for the precharging operation for the bit line to be completed so that the voltage of the bit line reaches a target voltage. The first period of time and the second period of time may be included in the precharging period, and as an example, the sum of the first period of time and the second period of time may be defined as the precharging period. The first period of time and the second period of time may be different, and in an example embodiment, the second period of time may be longer than the first period of time.

When the selected memory cell is in an ON state, after the capacitance of the bit line is charged by the charging current, the charging current may flow through the selected memory cell. Therefore, when the selected memory cell is in an ON state, the voltage of the bit line may be stabilized after the capacitance of the bit line is charged. When the selected memory cell is in an OFF state, the voltage of the bit line may increase even after the capacitance of the bit line is charged by the charging current. Therefore, with regard to the bit line to which the selected memory cell having an OFF state is connected, the precharging period may be prolonged.

In an example embodiment, after the precharging operation has started and the first period of time has elapsed, the state of the selected memory cell may be roughly determined and the amount of charge input to the bit line may be changed. As an example, when the state of the selected memory cell is determined to be in the OFF state, the amount of charge may be reduced and the precharging operation may be completed rapidly. Therefore, the time required for the precharging operation may be reduced. Further, the voltage of the bit line after the completion of the precharging operation of the page buffer may be determined to be the same level, regardless of the state of the selected memory cell.

Figure 6:
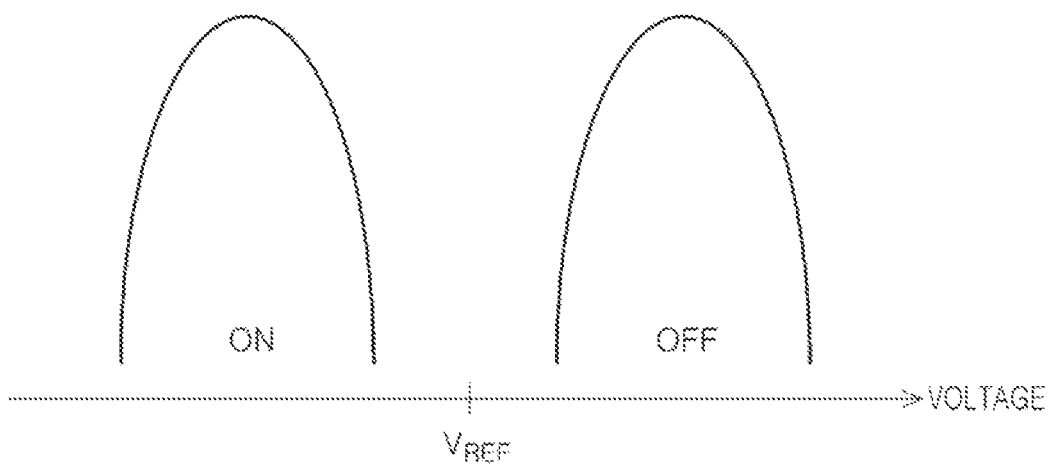
FIG. 6 is a view illustrating a reading operation of a memory device according to an example embodiment.

FIG. 6 is a drawing illustrating a reading operation of a memory device according to an example embodiment.

FIG. 6 is a diagram illustrating a threshold voltage distribution of memory cells included in the memory device. Referring to FIG. 6, when a memory cell is in an OFF state, a threshold voltage of the memory cell may be higher than a reference voltage $V_{REF}$. On the other hand, a threshold voltage of the memory cell having an ON state may be lower than the reference voltage $V_{REF}$.

In an example embodiment, the page buffer may read data of a selected memory cell among the memory cells and store the data in a latch circuit, and the reference voltage $V_{REF}$ may be a trip voltage that may change a latch value stored in the latch circuit included in the page buffer. As an example, when the voltage of the sensing node connected to the bit line in the page buffer is higher than the reference voltage $V_{REF}$, data corresponding to the OFF state may be stored in the latch circuit of the page buffer. Conversely, when the voltage of the sensing node is lower than the reference voltage $V_{REF}$, data corresponding to the ON state may be stored in the latch circuit of the page buffer.

Figure 7:
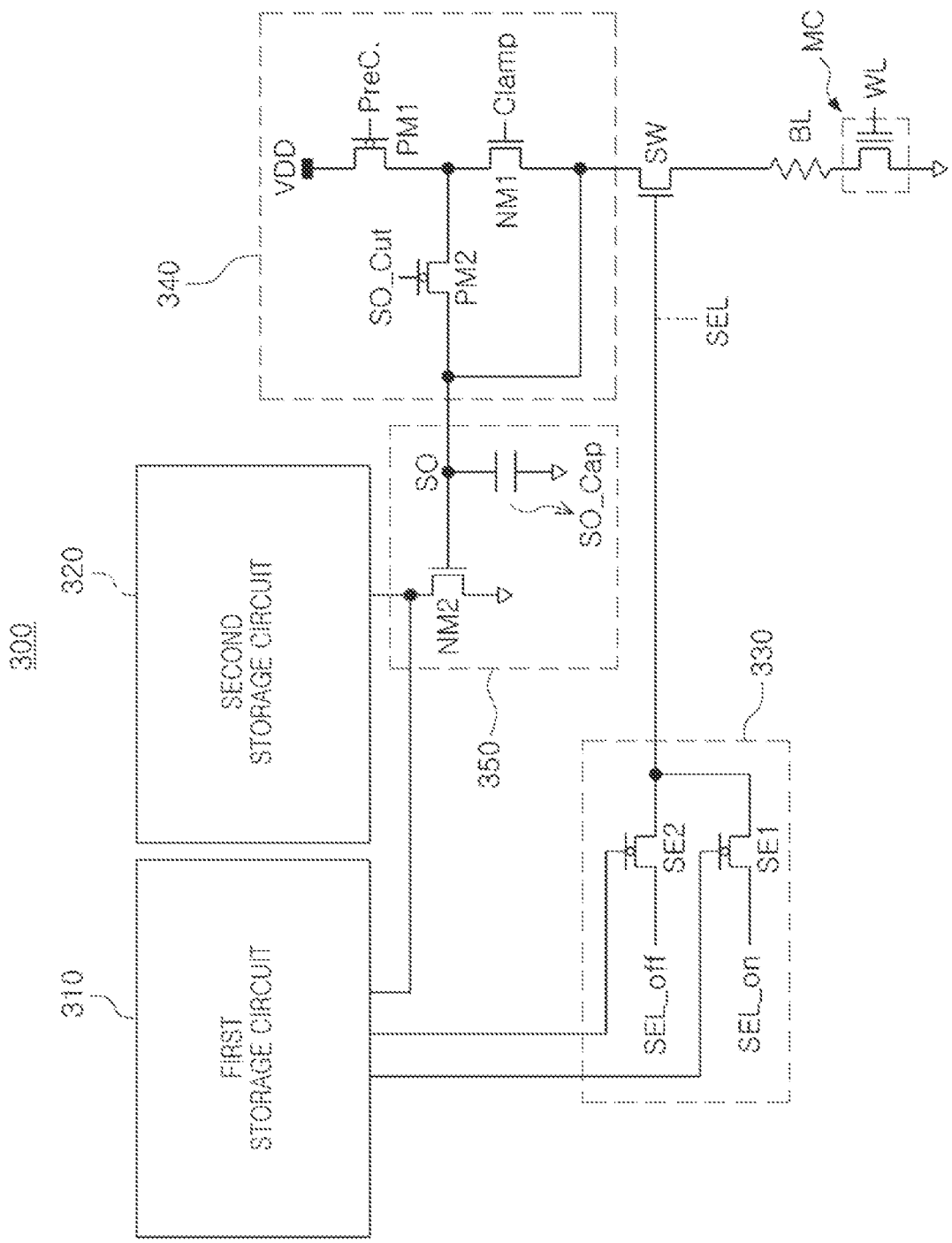
FIG. 7 is a circuit diagram schematically illustrating a page buffer according to an example embodiment.

FIG. 7 is a schematic circuit diagram of a page buffer according to an example embodiment.

Referring to FIG. 7, a page buffer 300 may include a first storage circuit 310, a second storage circuit 320, a selection circuit 330, a charging circuit 340, a sensing circuit 350, and the like. The charging circuit 340 may be connected to the bit line BL through a switch element SW, and the memory cell MC may be connected to the bit line BL. A gate of the memory cell MC may be connected to the word line WL.

Each of the first storage circuit 310 and the second storage circuit 320 may be implemented as a latch, a buffer or the like. The selection circuit 330 may include a first selection device SE1 and a second selection device SE2, and the first selection device SE1 and the second selection device SE2 may be controlled by data stored in the first storage circuit 310. The first selection device SE1 receives a first control voltage SEL_on, and the second selection device SE2 receives a second control voltage SEL_off. In an example embodiment, the first control voltage SEL_on and the second control voltage SEL_off may be a constant voltage, and may have different magnitudes.

When the switch element SW is turned on by the selection circuit 330, the charging circuit 340 may input a charging current to the bit line BL, and the precharging operation may be started. In a development operation after the precharging operation, the voltage of a sensing node SO included in the sensing circuit 350 may be changed depending on the state of the memory cell MC. For example, the voltage of the sensing node SO when the memory cell MC is OFF may be higher than the voltage of the sensing node SO when the memory cell MC is ON.

The first storage circuit 310 may roughly determine and store the state of the memory cell MC during the precharging operation. Operations of the first selection device SE1 and the second selection device SE2 may be changed depending on the state of the memory cell MC roughly determined by the first storage circuit 310, and the magnitude of the charging current input to the bit line BL may be changed. Hereinafter, the operation of the page buffer will be described in more detail with reference to FIGS. 8 to 10.

Figure 8:
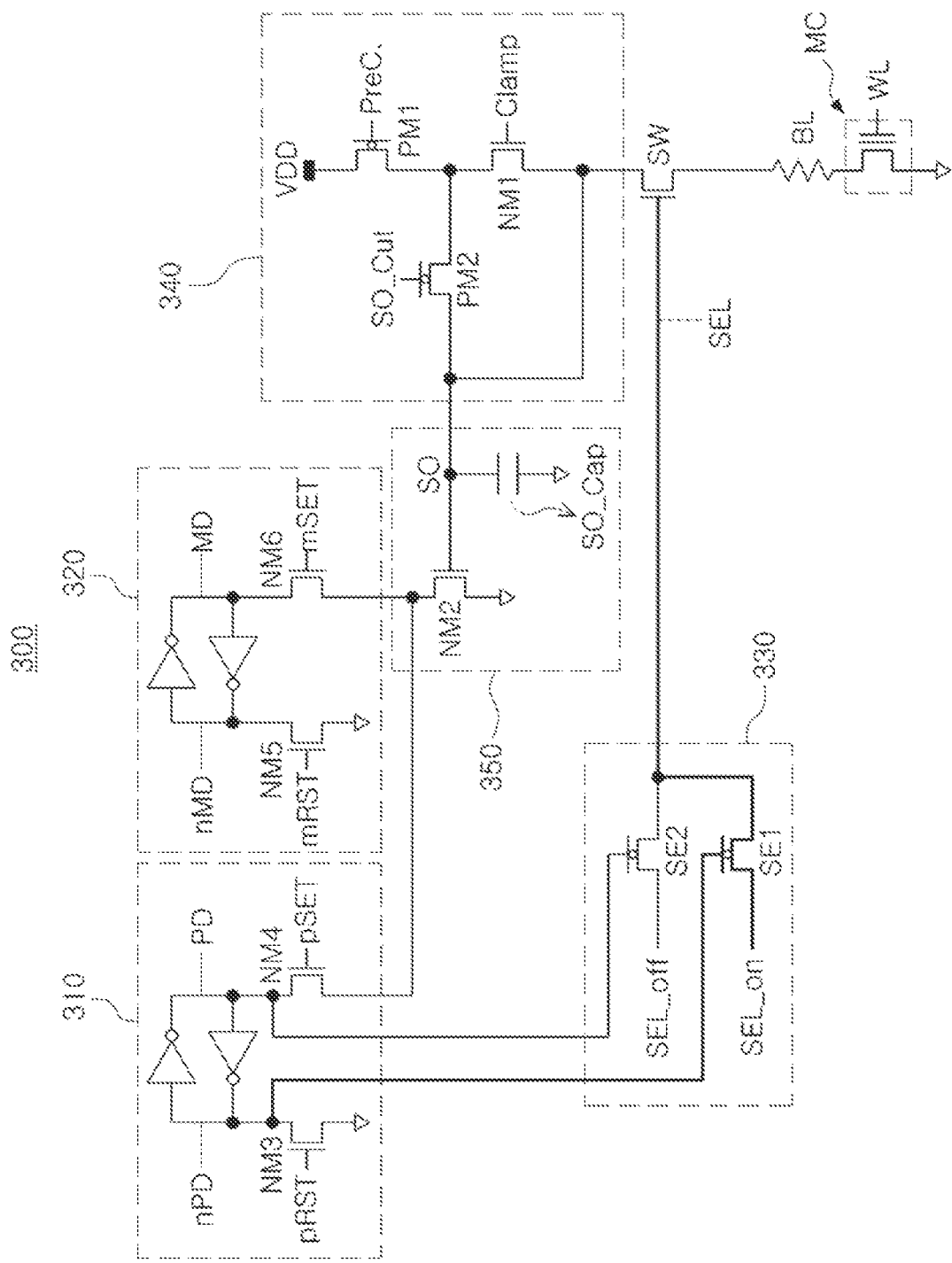
FIGS. 8 to 10 are circuit diagrams illustrating operations of a page buffer according to an example embodiment.
Figure 9:
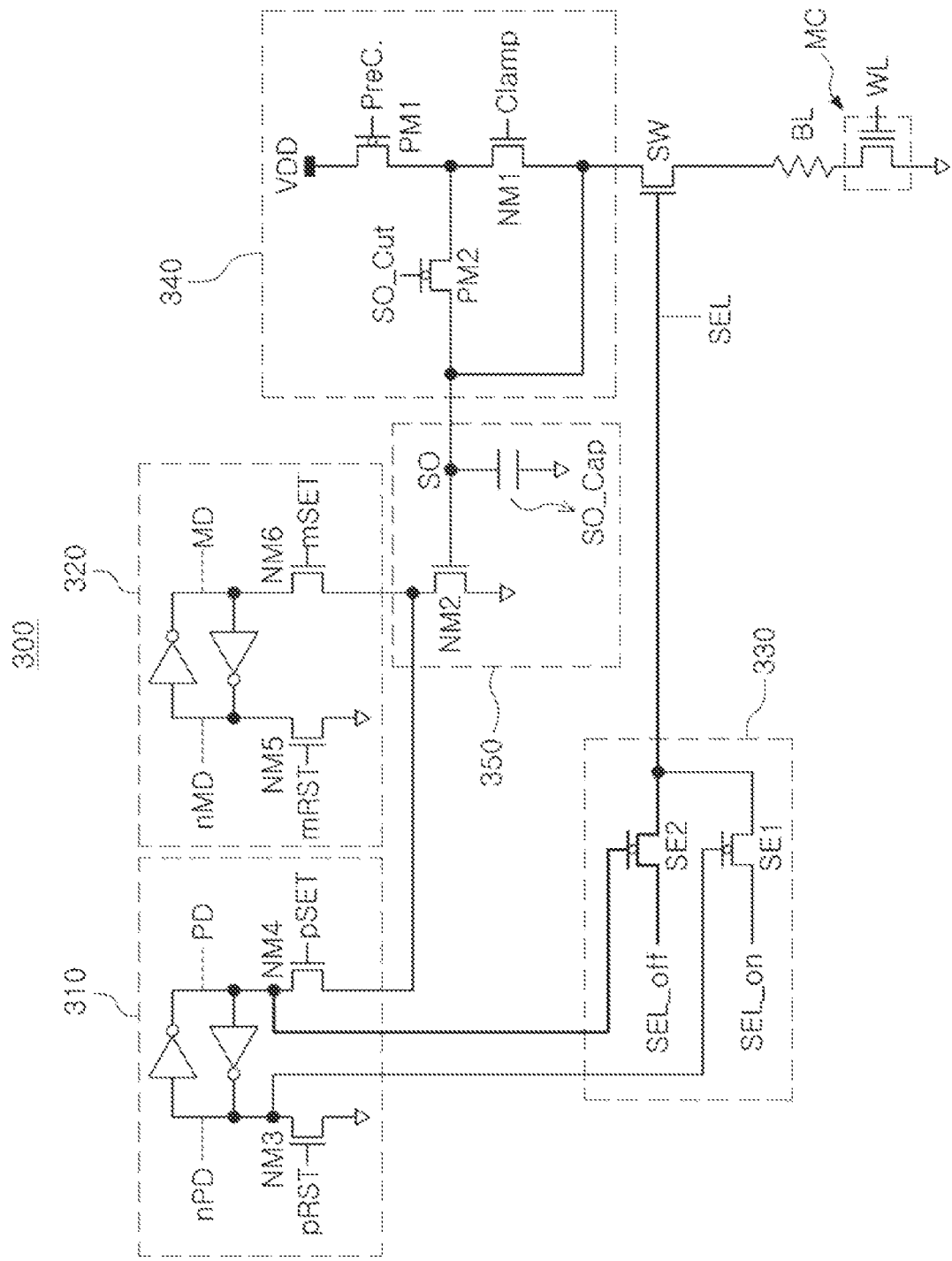
Figure 10:
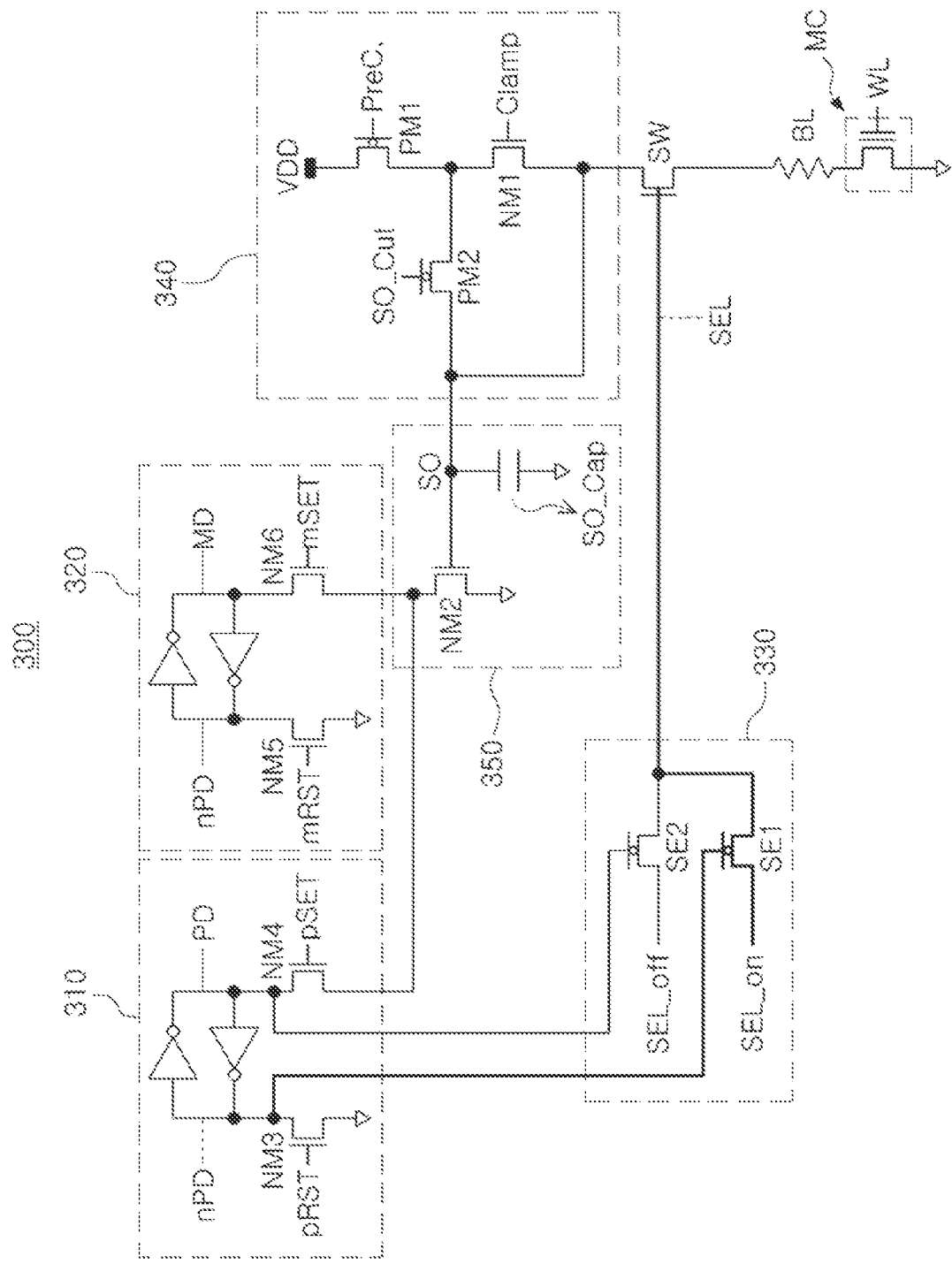

FIGS. 8 to 10 are circuit diagrams illustrating the operation of the page buffer according to an example embodiment.

Referring to FIGS. 8 to 10, the first storage circuit 310 and the second storage circuit 320 of the page buffer 300 may be both implemented as a latch circuit. In addition, the first storage circuit 310 and the second storage circuit 320 may also be implemented with various other circuits capable of storing data. In example embodiments illustrated with reference to FIGS. 8 to 10, control signals input to transistors included in the first storage circuit 310, the selection circuit 330, and the charging circuit 340 may be defined as illustrated in Table 1 below.

TABLE 1

| Control Signal | Initial Value | Pre-sensing ON | Pre-sensing OFF | Main Sensing ON | Main Sensing OFF |
| --- | --- | --- | --- | --- | --- |
| SO_Cut | LOW | HIGH | HIGH | HIGH | HIGH |
| pRST | HIGH | LOW | LOW | HIGH | HIGH |
| pSET | LOW | HIGH | HIGH | LOW | LOW |
| PD | HIGH | HIGH | LOW | HIGH | HIGH |
| nPD | LOW | LOW | HIGH | LOW | LOW |
| mRST | HIGH | HIGH | HIGH | LOW | LOW |
| mSET | LOW | LOW | LOW | HIGH | HIGH |
| MD | HIGH | HIGH | HIGH | HIGH | LOW |
| nMD | LOW | LOW | LOW | LOW | HIGH |

Transistors PM1, NM1 and PM2 of the charging circuit 340 are turned on and the bit line BL may be precharged when a reading operation of reading data from the memory cell MC is started. As an example, while the bit line BL is precharged, the first selection device SE1 may be turned on and the second selection device SE2 may be turned off, as illustrated in FIG. 8. Therefore, the first control voltage SEL_on input to the first selection device SE1 may be selected as a control voltage SEL of the switch element SW. The switch element SW is turned on by the first control voltage SEL_on, and the current flowing in the switch element SW may be a charging current supplying charge to the bit line BL.

When the precharging operation for the bit line BL is started and a first period of time has elapsed, the page buffer 300 may roughly read data from the memory cell MC and store the data in the first storage circuit 310. Referring to Table 1 together with FIGS. 8 to 10, a second PMOS transistor PM2 may be turned off to perform a pre-sensing operation of roughly reading data of the memory cell MC. In an example embodiment, the first period of time may be a period of time sufficient to charge the self-capacitance of the bit line BL. Therefore, the voltage of the sensing node SO after the lapse of the first period of time may be determined by the threshold voltage of the memory cell MC.

For example, when the threshold voltage of the memory cell MC is low, a current flowing in the memory cell MC may be generated by the charging current input to the bit line BL by the charging circuit 340, and the voltage of the sensing node SO may be relatively low. Conversely, when the threshold voltage of the memory cell MC is high, the magnitude of the current flowing in the memory cell MC is low, and the voltage of the sensing node SO may be relatively high.

For example, when the threshold voltage of the memory cell MC is high, in a case in which the memory cell MC is OFF, a second NMOS transistor NM2 of the sensing circuit 350 may be turned on by the voltage of the sensing node SO. When a reset signal pRST of the first storage circuit 310 is set to be a low logic value and a set signal pSET is set to be a high logic value, the low logic value is stored in a PD node of the first storage circuit 310, and the high logic value may be stored in an nPD node. Therefore, as illustrated in FIG. 9, in the selection circuit 330, the first selection device SE1 may be turned off and the second selection device SE2 may be turned on, and the control voltage SEL_off may be input to the gate of the switch element SW.

When the threshold voltage of the memory cell MC is low, for example, when the memory cell MC is in an ON state, the second NMOS transistor NM2 may not be turned on by the voltage of the sensing node SO. Accordingly, the high logic value stored in the PD node of the first storage circuit 310 and the low logic value stored in the nPD node may be maintained. As illustrated in FIG. 10, the first selection device SE1 of the selection circuit 330 may be continuously turned on, and the second selection device SE2 may be continuously turned off. The control voltage SEL input to the switch element SW may be maintained as the first control voltage SEL_on.

In an example embodiment, the second control voltage SEL_off may be lower than the first control voltage SEL_on. When the selection circuit 330 outputs the second control voltage SEL_off, the current flowing in the switch element SW decreases, and thus the charging current input to the bit line BL may decrease. According to an example embodiment, when the memory cell MC is in an OFF state, the time required to complete the precharging operation for the bit line BL may be reduced by changing the output of the selection circuit 330 from the first control voltage SEL_on to the second control voltage SEL_off.

The data of the memory cell MC read through the pre-sensing may be used to determine whether to change the output of the selection circuit 330. After the pre-sensing and precharging operations are completed, a main sensing operation of reading data of the memory cell MC and storing the data in the second storage circuit 320 may be performed. Control signals input to the transistors included in the second storage circuit 320, the selection circuit 330 and the charging circuit 340 to perform the main sensing operation may be defined as illustrated in Table 1 above. In the operation of the page buffer 300 described with reference to FIGS. 8 through 10, the voltage input to the word line WL of the memory cell MC may be constant.

Figure 11:
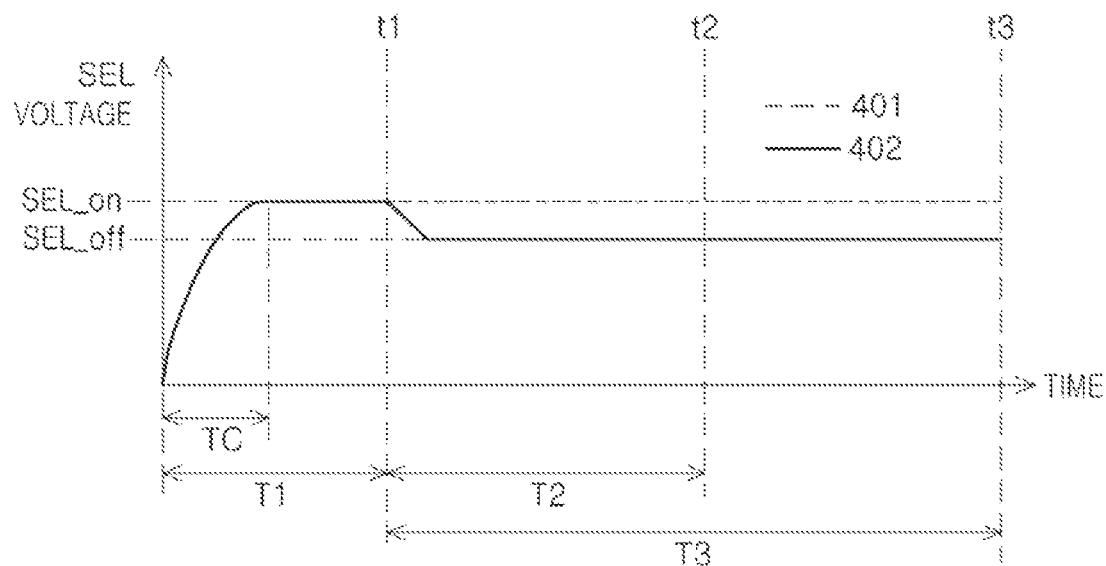
FIGS. 11 to 13 are graphs illustrating operations of a memory device according to example embodiments.
Figure 12:
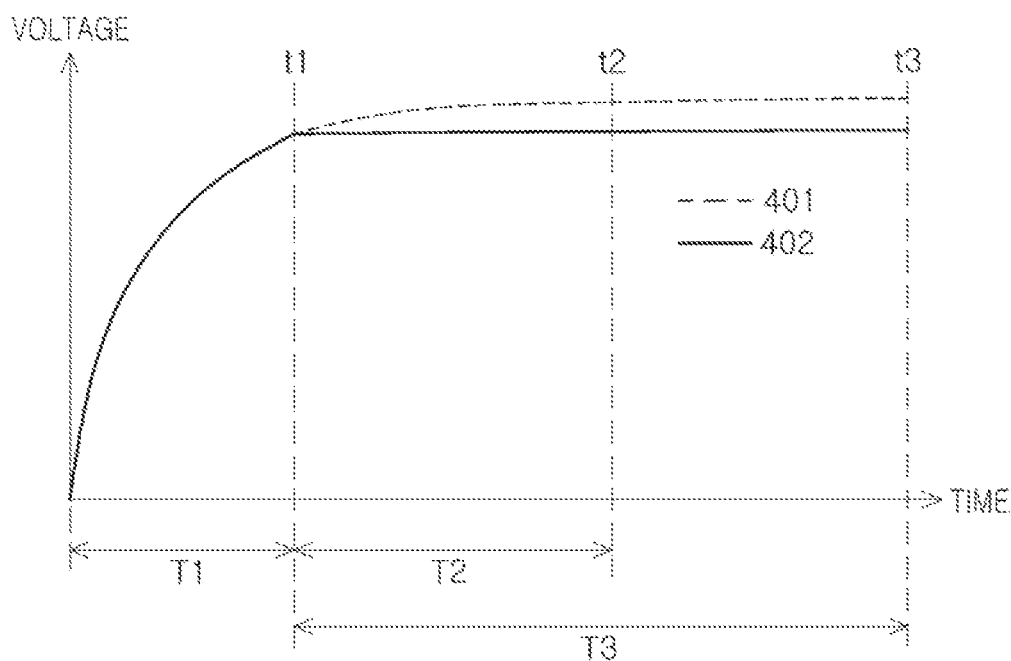
Figure 13:
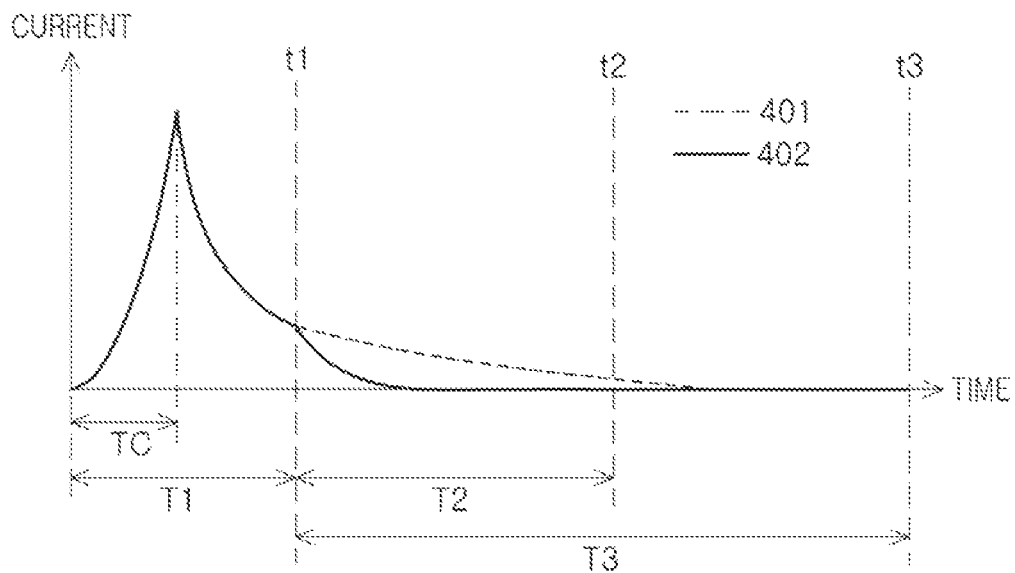

FIGS. 11 to 13 are graphs illustrating operations of a memory device according to example embodiments. Hereinafter, for convenience of description, operations of the memory device will be described together with reference the page buffer 300 illustrated in FIG. 7.

FIG. 11 is a graph illustrating an output of the selection circuit 330 depending on the state of the memory cell MC. FIG. 12 may be a graph illustrating the voltage of the bit line BL according to the state of the memory cell MC and the output of the selection circuit 330. FIG. 13 may be a graph illustrating the current of the bit line BL depending on the state of the memory cell MC and the output of the selection circuit 330.

In the example embodiments described with reference to FIGS. 11 to 13, the page buffer 300 approximately reads data of the memory cell MC during a first period of time T1 or after the first period of time T1 elapses to store the data in the first storage circuit 310. A second period of time T2 and a third period of time T3 may be periods of time required for the page buffer 300 to complete the precharging operation on the bit line BL according to example embodiments.

FIG. 11 is a graph illustrating a change in the control voltage SEL according to example embodiment 402 of the present inventive concept together with comparative example 401. Referring to FIG. 11, in the comparative example 401, the magnitude of the control voltage SEL is fixed, whereas in the example embodiment 402, the control voltage SEL may be reduced from the first control voltage SEL_on to the second control voltage SEL_off at a first point in time t1. The first point in time t1 may be an end point of the first period of time T1. The example embodiment 402 may correspond to a case in which the state of the memory cell MC, in which the page buffer 300 is to read data, is in an OFF state.

FIGS. 12 and 13 are graphs illustrating voltages and currents of the bit line BL, respectively. Referring to FIGS. 12 and 13, the first period of time T1 may include a charging time TC required to charge the capacitance of the bit line BL. The voltage and current of the bit line BL may increase during the charging time TC, and the current of the bit line BL may decrease when the charging time TC elapses.

Unlike the comparative example 401, in the example embodiment 402, the control voltage SEL input to the switch element SW may decrease at the first point in time t1. Therefore, after the first point in time t1, the current supplied to the bit line BL by the charging circuit 340 through the switch element SW may rapidly decrease, and the voltage of the bit line BL may also be reduced after the first point in time t1. Meanwhile, in the comparative example 401, the voltage of the bit line BL may increase even after the first point in time t1. In the example embodiment 402, the voltage of the bit line BL may be stabilized relatively faster than that in the comparative example 401, and the time required for the precharging operation of charging the bit line BL may be determined by a sum of the first period of time T1 and the second period of time T2. In contrast, in the comparative example 401, the time required for the precharging operation may be determined by a sum of the first period of time T1 and the third period of time T3. In the example embodiment 402, the precharging operation is terminated at the second point in time t2, whereas in the comparative example 401, the precharging operation is terminated at the third point in time t3 later than the second point in time t2.

When the memory cell MC is in an ON state, in example embodiments, the selection voltage SEL may be maintained at the first control voltage SEL_on, similarly to the comparative example 401. When the memory cell MC is in an ON state, a portion of a current supplied to the bit line BL by the charging circuit 340 may flow through the memory cell MC, and the voltage and current of the bit line BL may be stabilized faster than that in the case in which the memory cell MC is in an OFF state.

According to example embodiments, when the memory cell MC is in an OFF state, the selection voltage SEL is reduced to the second control voltage SEL_off at the first point in time t1, and when the memory cell MC is in an ON state, the selection voltage SEL may be maintained as the first control voltage SEL_on. Therefore, the time required for the precharging operation may be set to be substantially the same regardless of the state of the memory cell MC. In addition, when simultaneously charging the plurality of bit lines BL, the precharging operations on the plurality of bit lines BL may be terminated approximately the same, thereby improving the speed of the reading operation of the memory device and reducing power consumption.

Figure 14:
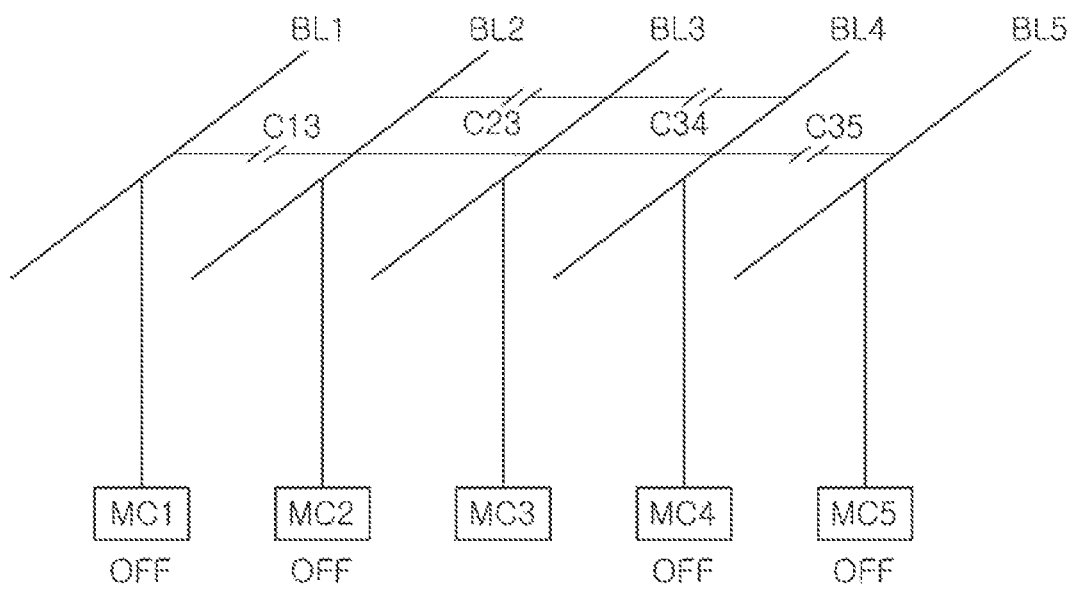
FIGS. 14 to 16 are diagrams illustrating operations of a memory device according to example embodiments.
Figure 15:
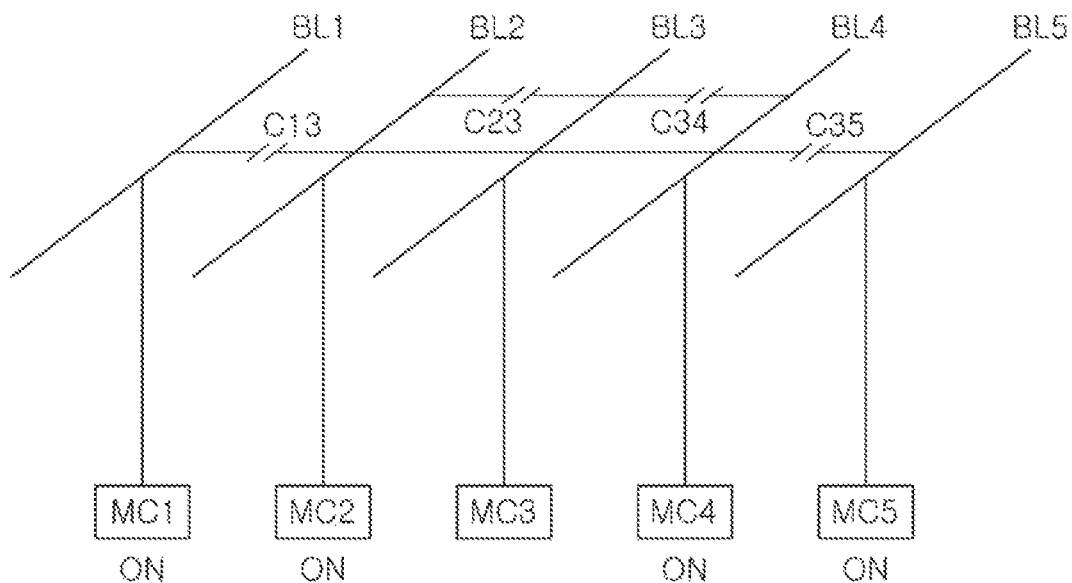
Figure 16:
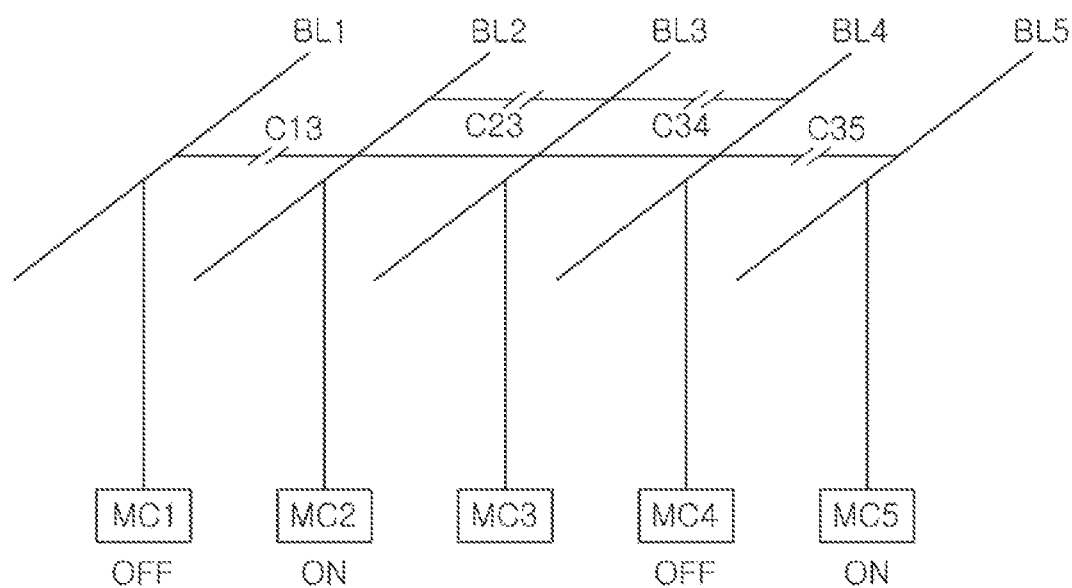

FIGS. 14 to 16 are diagrams illustrating operations of a memory device according to example embodiments.

Referring to FIGS. 14 to 16, a memory device may include a plurality of bit lines BL1 to BL5 and a plurality of memory cells MC1 to MC5 connected to the plurality of bit lines BL1 to BL5. Hereinafter, for convenience of description, a case in which the page buffer performs a reading operation of reading data of a third memory cell MC3 through a third bit line BL3 will be described.

The page buffer may perform a precharging operation of increasing the voltage of the third bit line BL3 to a target voltage, to read data of the third memory cell MC3. In the example embodiments of FIGS. 14 to 16, the bit lines BL1 to BL5 may be simultaneously charged by a precharging operation. In the precharging operation, to increase the voltage of the third bit line BL3 to a required voltage magnitude, the current may be supplied to the bit lines BL1 to BL5, by the time enough to charge coupling capacitance C13, C23, C34 and C35 between the bit lines BL1 to BL5.

The time required for the precharging operation may also be changed depending on the states of neighboring memory cells MC1, MC2, MC4 and MC5 provided around the third memory cell MC3, which is a selected memory cell. As an example, as illustrated in FIG. 14, in a case in which the neighboring memory cells MC1, MC2, MC4 and MC5 of the third memory cell MC3 are in an OFF state, a time required for the precharging operation may be greatly increased. Since the bit lines BL1 to BL5 are simultaneously charged, in the case in which the neighboring memory cells MC1, MC2, MC4 and MC5 are in an OFF state, the time required for a precharging operation to charge the neighboring bit lines BL1, BL2, BL4 and BL5 may be increased. On the other hand, as illustrated in FIG. 15, when the neighboring memory cells MC1, MC2, MC4 and MC5 are in an ON state, the time required for the precharging operation may be relatively reduced. As illustrated in FIG. 16, when a portion of the neighboring memory cells MC1, MC2, MC4 and MC5 is in an OFF state and the remaining memory cells are in an ON state, the time required for the precharging operation is shorter than that of the example embodiment illustrated in FIG. 14, and may be longer than that of the example embodiment illustrated in FIG. 15.

In an example embodiment, the states of the memory cells MC1 to MC5 are approximately determined first, and the amount of charges charging the bit lines BL1 to BL5 may be adjusted depending on the states of the memory cells MC1 to MC5. For example, the magnitude of the charging current input to each of the bit lines BL1 to BL5 simultaneously charged may be changed depending on the states of the memory cells MC1 to MC5. As an example, when the states of the memory cells MC1 to MC5 are determined to be in an OFF state, the magnitude of the charging current that charges the bit lines BL1 to BL5 may be reduced in the midst of the precharging operation. Therefore, regardless of the states of the memory cells MC1 to MC5, the end timings of the precharging operations for the bit lines BL1 to BL5 simultaneously charged may coincide with each other, and the time and power consumption required for the precharging operation may be reduced.

Figure 17:
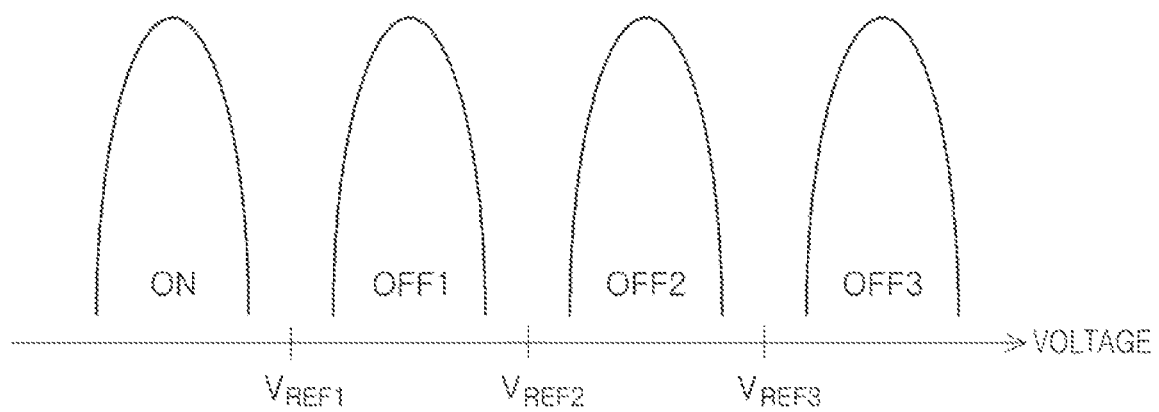
FIG. 17 is a drawing illustrating a reading operation of a memory device according to an example embodiment.

FIG. 17 is a drawing illustrating a reading operation of a memory device according to an example embodiment.

In an example embodiment illustrated in FIG. 17, memory cells of a memory device may store two bits of data. The memory cells may operate as multi-level cells (MLCs), and thus the memory cells may have a plurality of OFF states (OFF1 to OFF3). When the memory cells operate as triple level cells or quad level cells, the number of OFF states that the memory cells may have may further increase.

The page buffer may determine data of the selected memory cell by comparing the threshold voltage of the selected memory cell with a plurality of reference voltages $V_{REF1}$ to $V_{REF3}$. As an example, the page buffer may include a plurality of latch circuits, and latch values of the plurality of respective latch circuits may be changed by trip voltages having different magnitudes. In an example embodiment, the trip voltages of the plurality of latch circuits may correspond to the plurality of reference voltages $V_{REF1}$ to $V_{REF3}$.

The page buffer may also roughly detect the state of the selected memory cell to determine whether to change the magnitude of the charging current input to the bit line connected to the selected memory cell. As an example, the magnitude of the charging current input to the bit line connected to the selected memory cell having the third OFF state OFF3 may be lower than that of a charging current input to the bit line connected to the selected memory cell having the first OFF state OFF1. As an example, as the threshold voltage of the selected memory cell increases, the page buffer may increase a decrease in charging current input to the bit line connected to the selected memory cell.

Figure 18:
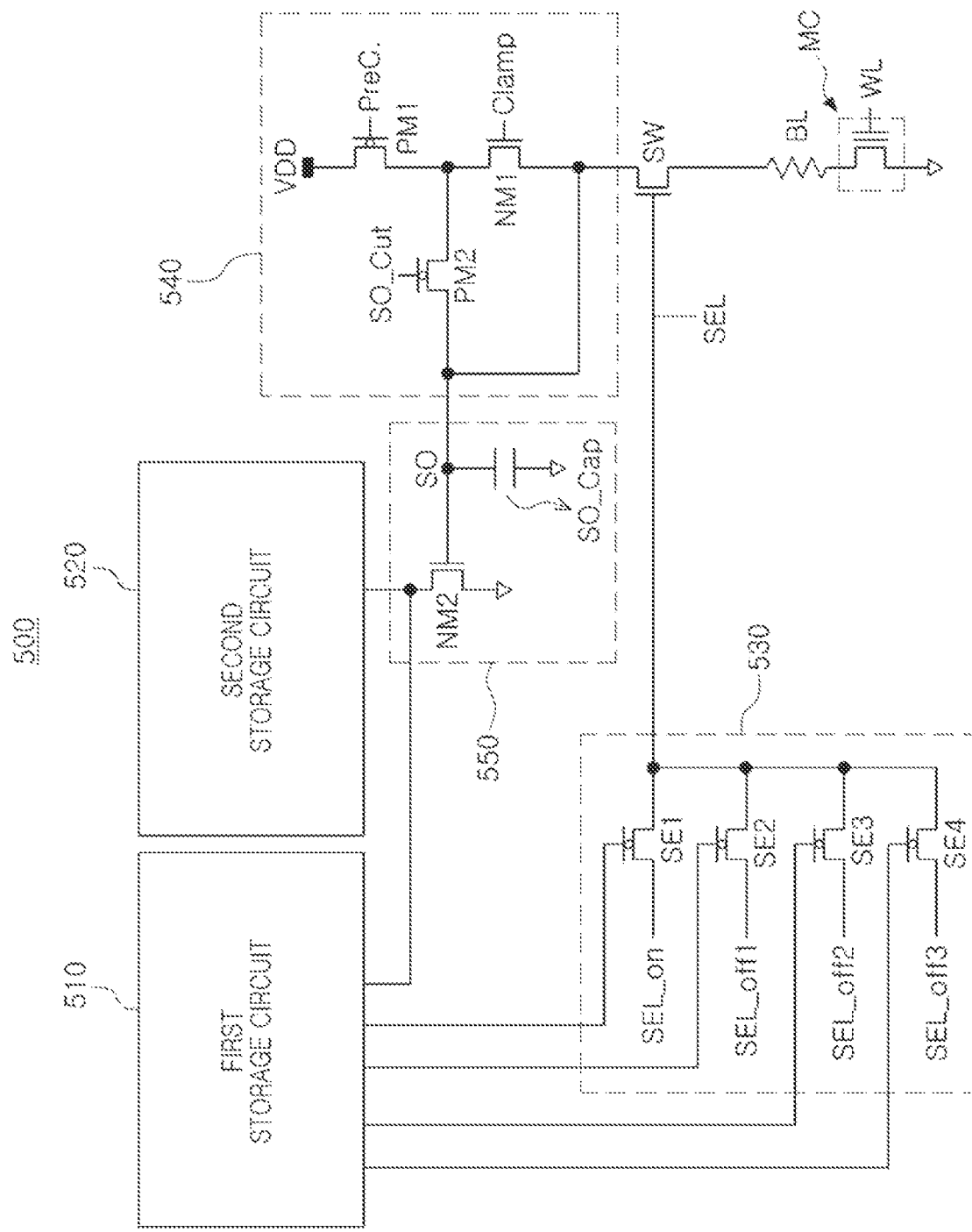
FIG. 18 is a circuit diagram schematically illustrating a page buffer according to an example embodiment.

FIG. 18 is a circuit diagram schematically illustrating a page buffer according to an example embodiment.

Referring to FIG. 18, a page buffer 500 may include a first storage circuit 510, a second storage circuit 520, a selection circuit 530, a charging circuit 540, a sensing circuit 550 and the like. The configuration and operations of the second storage circuit 520, the charging circuit 540, and the sensing circuit 550 may be similar to those described with reference to FIG. 7.

In an example embodiment illustrated in FIG. 18, the selection circuit 530 may include first to fourth selection devices SE1 to SE4. The first to fourth selection devices SE1 to SE4 may receive first to fourth control voltages SEL_on to SEL_off3. The first to fourth control voltages SEL_on to SEL_off3 may be constant voltages having different magnitudes. As an example, the first control voltage SEL_on may be a lowest voltage, and the fourth control voltage SEL_off3 may be a highest voltage. The second control voltage SEL_off1 may be lower than the third control voltage SEL_off2.

The first storage circuit 510 may include a plurality of latch circuits, and the plurality of latch circuits included in the first storage circuit 510 may operate by different trip voltages. As an example, the first storage circuit 510 may include a first latch circuit controlling the first selection device SE1 and the second selection device SE2, and a second latch circuit controlling the third selection device SE3 and the fourth selection device SE4.

The charging circuit 540 may charge the capacitance of the bit line BL by inputting a charging current to the bit line BL for a first period of time. During the first period of time, the page buffer 500 may roughly determine data of the memory cell MC using the voltage of the sensing node SO. The page buffer 500 may roughly determine data stored in the memory cell MC using the threshold voltage of the memory cell MC.

As described with reference to FIG. 17, the memory cell MC may have a plurality of OFF states OFF1 to OFF3. When the state of the memory cell MC is determined to be the first OFF state OFF1, the second selection device SE2 of the selection circuit 530 is turned on and the remaining selection devices SE1, SE3 and SE4 may be turned off, such that the second control voltage SEL_off1 may be input to the switch element SW as a control voltage. Similarly, when the state of the memory cell MC is determined to be the second OFF state OFF2, the third selection device SE3 of the selection circuit 530 is turned on and the remaining selection devices SE1, SE2 and SE4 may be turned off, such that the third control voltage SEL_off2 may be input to the switch element SW. In an example embodiment, the number of control voltages that the selection circuit 530 may input to the switch element SW may be determined depending on the number of states that the memory cell MC may have.

Figure 19:
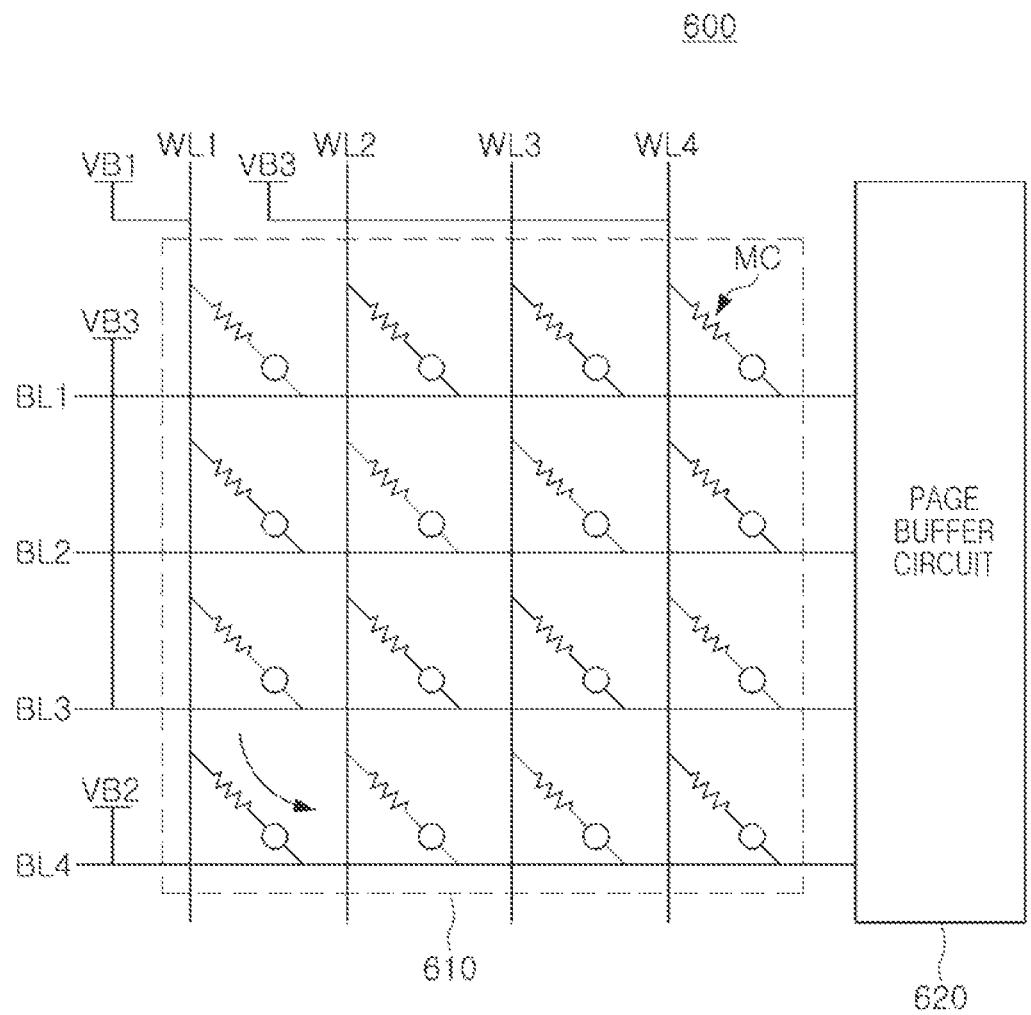
FIG. 19 is a block diagram schematically illustrating a memory device according to an example embodiment.

FIG. 19 is a block diagram schematically illustrating a memory device according to an example embodiment.

In an example embodiment illustrated in FIG. 19, a memory device 600 may include a memory cell array 610, a page buffer circuit 620, and the like. The memory cell array 610 may include first to fourth bit lines BL1 to BL4, first to fourth word lines WL1 to WL4, and a plurality of memory cells MC. The plurality of memory cells MC may be provided at points on which the first to fourth bit lines BL1 to BL4 and the first to fourth word lines WL1 to WL4 intersect each other. Each of the memory cells MC may include a switch element and a variable resistance element, and may record data using a change in resistance of the variable resistance element.

In the example embodiment illustrated in FIG. 19, the page buffer circuit 620 may read data from a selected memory cell connected to the first word line WL1 and the fourth bit line BL4. The first word line WL1 connected to the selected memory cell is provided as a select word line and receives a first bias voltage VB1, and the fourth bit line BL4 connected to the selected memory cell is provided as a selected bit line and may receive a second bias voltage VB2. A third bias voltage VB3 may be input to the second to fourth word lines WL2 to WL4 and the first to third bit lines BL1 to BL3, which are not connected to the selected memory cell. The input method of the bias voltages VB1, VB2 and VB3 may be modified differently from that illustrated in FIG. 21.

For example, the first bias voltage VB1 may be higher than the second bias voltage VB2, and the third bias voltage VB3 may be lower than the first bias voltage VB1 and higher than the second bias voltage VB2. Therefore, a voltage difference applied to the selected memory cell may be greater than a voltage difference applied to non-selected memory cells, and in detail, current may flow only through a selected memory cell. The page buffer circuit 620 may generate a read voltage using a current flowing in the selected memory cell and the fourth bit line BL4, and compare the read voltage with a predetermined reference voltage to determine data written to the selected memory cell.

In an example embodiment, the page buffer circuit 620 may perform a precharging operation, using the first bias voltage VB1 input to the first word line WL1, which is a select word line and the second bias voltage VB2 input to the fourth bit line BL4, which is a selected bit line. In addition, the page buffer circuit 620 may perform a pre-sensing operation of roughly determining data of the selected memory cell by using a voltage and/or a current of the selected memory cell.

In an example embodiment, when it is determined that the resistance of the variable resistance element included in the selected memory cell is relatively high in the pre-sensing operation, the page buffer circuit 620 may include a difference between the first bias voltage VB1 and the second bias voltage VB2. On the other hand, when it is determined that the resistance of the variable resistance element included in the selected memory cell is relatively low in the pre-sensing operation, the page buffer circuit 620 may maintain the magnitude of the first bias voltage VB1 and the second bias voltage VB2.

Figure 20:
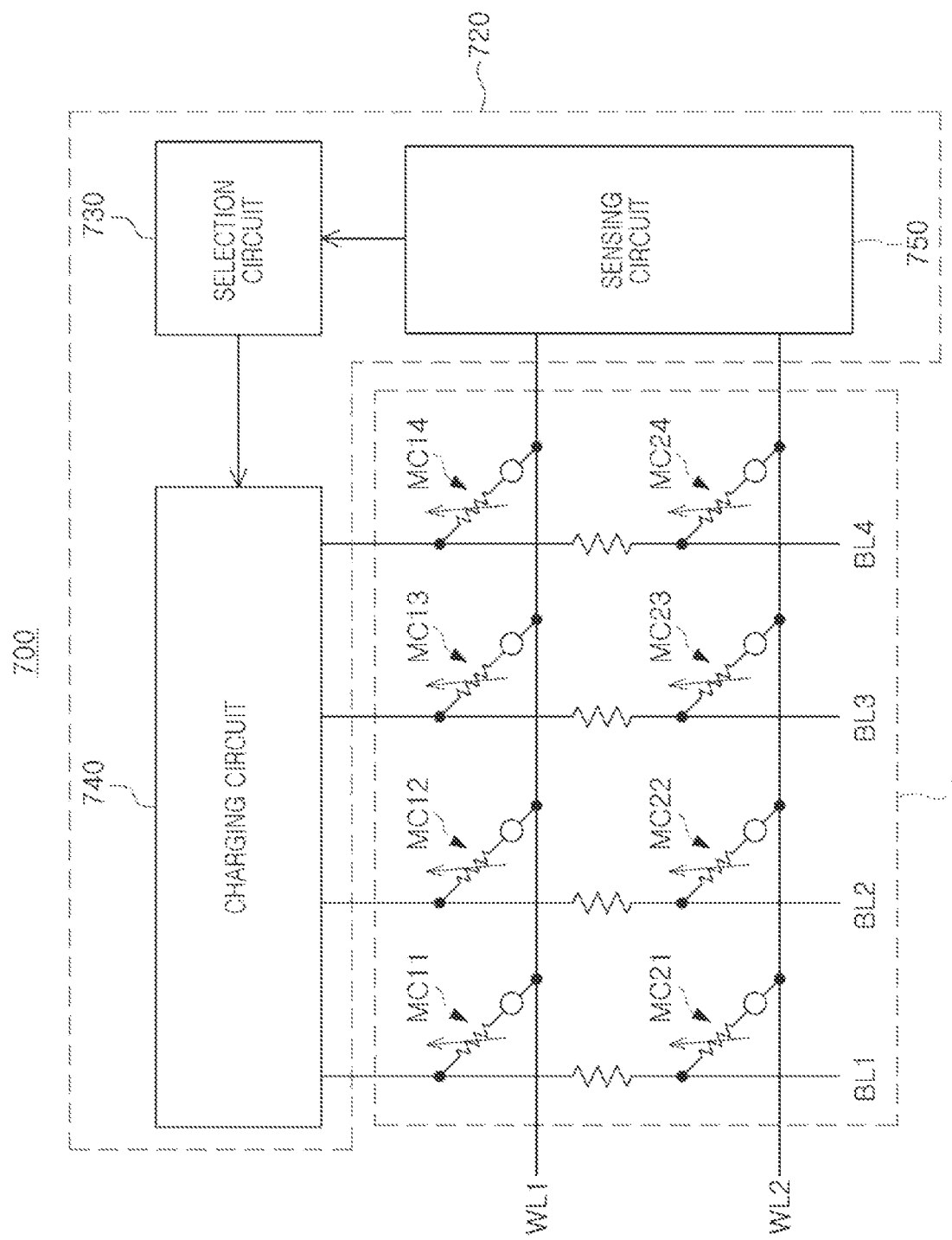
FIG. 20 is a block diagram schematically illustrating a memory device according to an example embodiment.

FIG. 20 is a block diagram schematically illustrating a memory device according to an example embodiment.

Referring to FIG. 20, a memory device 700 may include a memory cell array 710 and a page buffer circuit 720, and the page buffer circuit 720 may include a selection circuit 730, a charging circuit 740, a sensing circuit 750, and the like. The memory cell array 710 may include a plurality of memory cells MC11 to MC14 and MC21 to MC24 connected to a plurality of word lines WL1 to WL2 and a plurality of bit lines BL1 to BL4.

When a select word line and a selected bit line are respectively determined among the word lines WL1 to WL2 and the bit lines BL1 to BL4, a bias voltage may be input to each of the word lines WL1 to WL2 and the bit lines BL1 to BL4 by the charging circuit 740 and the sensing circuit 750. A voltage difference may occur in the respective memory cells MC11 to MC14 and MC21 to MC24 by the bias voltage, and the voltage difference occurring in the selected memory cell may be higher than a voltage difference occurring in the non-selected memory cell.

As an example, when the first word line WL1 and the first bit line BL1 are determined as the select word line and the selected bit line, the bias voltage may be applied to both terminals of the selected memory cells MC11 such that a relatively high voltage difference occurs. When the bias voltage is input by the charging circuit 740 and the sensing circuit 750, the sensing circuit 750 may perform a pre-sensing operation of roughly determining data of the selected memory cell MC11.

In an example embodiment, when it is determined that the resistance of a variable resistance element of the selected memory cell MC11 is relatively high by the pre-sensing operation, the difference of voltage applied to the selected memory cell MC11 by the charging circuit 740 and the sensing circuit 750 may be reduced. When it is determined that the resistance of the variable resistance element of the selected memory cell MC11 is relatively low by the pre-sensing operation, the charging circuit 740 and the sensing circuit 750 may maintain the voltage difference applied to the selected memory cell MC11. Therefore, the voltage difference between the selected bit line BL1 and the select word line WL1 appearing depending on data of the selected memory cell MC11 may be significantly reduced, and the speed of the reading operation may be improved and power consumption may be reduced.

Figure 21:
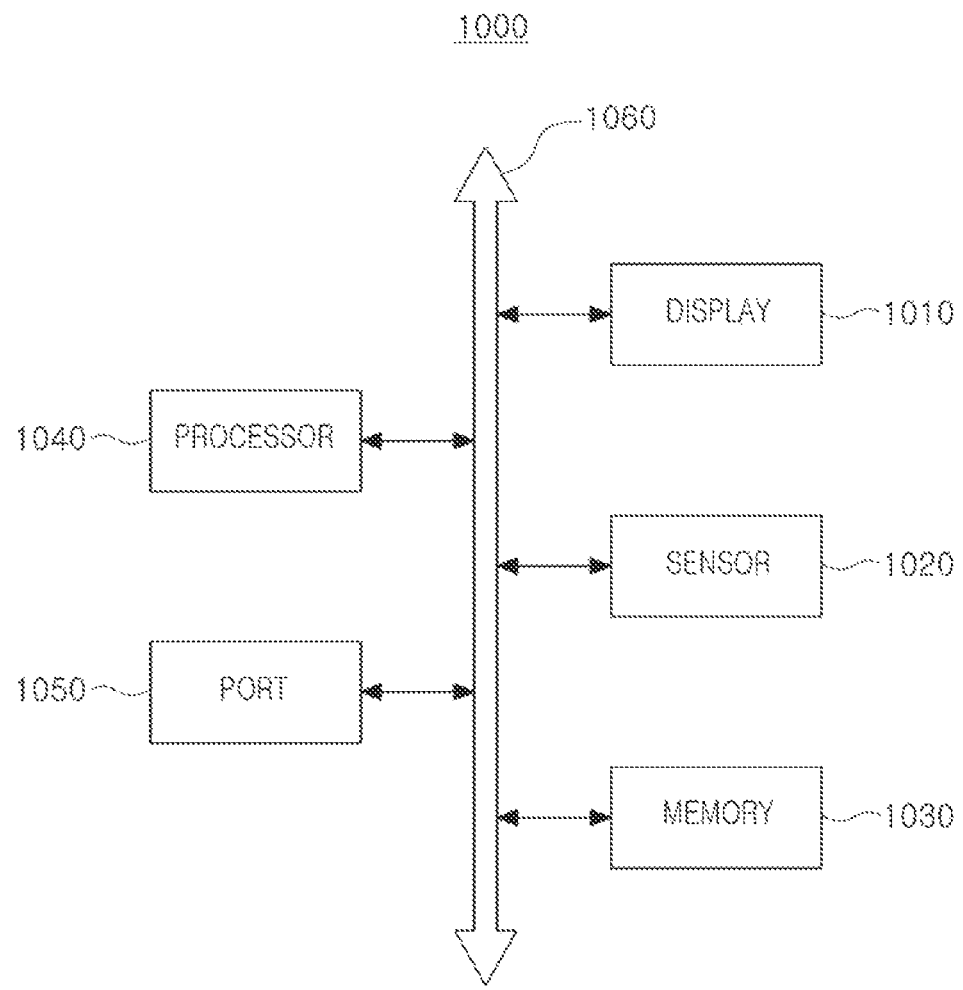
FIG. 21 is a block diagram illustrating an electronic apparatus including a memory device according to an example embodiment.

FIG. 21 is a block diagram of an electronic apparatus including a memory device according to an example embodiment.

An electronic apparatus 1000 illustrated in FIG. 21 may include a display 1010, a sensor 1020, a memory 1030, a processor 1040, a port 1050, and the like. The electronic apparatus 1000 may further include a wired/wireless communications device, a power supply device, and the like. Among constituent elements illustrated in FIG. 21, the processor 1040 may be a device provided to allow the electronic apparatus 1000 to communicate with a video card, a sound card, a memory card, a USB device, and the like. The electronic apparatus 1000 may be a comprehensive concept including a smartphone, a tablet PC, a smart wearable device, and the like, as well as a general desktop computer and a laptop computer.

The port 1050 may perform specific operations, commands, tasks, and the like. The port 1050 may be a central processing unit (CPU) or a microprocessor unit (MCU), and may communicate with the display 1010, the sensor 1020, and the memory device 1030 via a bus 1060 and may also communicate with other devices connected to the processor 1040.

The memory 1030 may be a storage medium storing data required for operations of the electronic apparatus 1000, multimedia data, or the like. The memory 1030 may include a volatile memory, such as a random access memory (RAM), or a nonvolatile memory, such as a flash memory and the like. The memory 1030 may also include at least one of a solid state drive (SSD), a hard disk drive (HDD), and an optical drive (ODD), as a storage device. The memory 1030 may include any one of the memory devices according to various example embodiments described above with reference to FIGS. 1 to 20.

As set forth above, according to example embodiments, while the voltage of a bit line is increased, data of a selected memory cell connected to a bit line is read and stored in a storage circuit. The magnitude of voltage input to the bit line may be adjusted depending on the data stored in the storage circuit. Therefore, the time required for the precharging operation to charge the bit line may be reduced, thereby improving performance of the memory device.

While example embodiments have been shown and described above, it will be apparent to those skilled in the art that modifications and variations could be made without departing from the scope of the present inventive concept as defined by the appended claims.

What is claimed is:

1. A memory device comprising:
a memory cell array including a plurality of memory cells, and a plurality of bit lines connected to the plurality of memory cells; and
a memory controller configured to read data corresponding to a threshold voltage of a selected memory cell connected to a selected bit line among the plurality of bit lines, input a first charging current to the selected bit line during a first period of time, and input a second charging current lower than the first charging current to the selected bit line during a second period of time, after the first period of time, when the threshold voltage of the selected memory cell is higher than a reference voltage.

2. The memory device of claim 1, wherein, when the threshold voltage of the selected memory cell is lower than the reference voltage, the first charging current is input to the selected bit line during the second period of time.

3. The memory device of claim 1, wherein the memory controller comprises:

a charging circuit connected to the selected bit line by a switch element;
a storage circuit configured to read and store data of the selected memory cell; and
a selection circuit configured to determine a current of the switch element as one of the first charging current and the second charging current, based on data stored in the storage circuit.

4. The memory device of claim 3, wherein the storage circuit comprises a first storage circuit configured to read and store data corresponding to a first threshold voltage of the selected memory cell during the first period of time, and a second storage circuit configured to read and store data corresponding to a second threshold voltage of the selected memory cell during the second period of time, and
wherein the selection circuit is further configured to determine the current of the switch element as one of the first charging current and the second charging current during the second period of time, based on data stored in the first storage circuit.

5. The memory device of claim 1, wherein the reference voltage has a first reference voltage, and a second reference voltage higher than the first reference voltage.

6. The memory device of claim 5, wherein the memory controller is further configured to:
when the threshold voltage of the selected memory cell is higher than the first reference voltage and lower than the second reference voltage, input the second charging current to the selected bit line during the second period of time, and
when the threshold voltage of the selected memory cell is higher than the second reference voltage, input a third charging current lower than the second charging current to the selected bit line during the second period of time.

7. The memory device of claim 1, wherein the selected bit line comprises a first selected bit line and a second selected bit line, and the selected memory cell comprises a first selected memory cell connected to the first selected bit line and a second selected memory cell connected to the second selected bit line; and
the memory controller is further configured to simultaneously charge the first selected bit line and the second selected bit line.

8. The memory device of claim 7, wherein the memory controller is further configured to determine a charging current input to each of the first selected bit line and the second selected bit line during the second period of time, based on a first threshold voltage of the first selected memory cell and a second threshold voltage of the second selected memory cell.

* * * * *